US012713896B2

(12) United States Patent
Wu et al.

(10) Patent No.: US 12,713,896 B2
(45) Date of Patent: Aug. 18, 2026

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventors: Hsien-Chang Wu, Taichung (TW); Shih-Kang Fu, Taoyuan (TW); Shin-Yi Yang, New Taipei (TW); Hsu-Wei Liu, Taichung (TW); Ting-Ya Lo, Hsinchu (TW); Ming-Han Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 346 days.

(21) Appl. No.: 18/369,190

(22) Filed: Sep. 17, 2023

(65) Prior Publication Data

US 2025/0096140 A1 Mar. 20, 2025

(51) Int. Cl.
*H10W 20/41* (2026.01)
*H10W 20/00* (2026.01)

(52) U.S. Cl.
CPC ....... *H10W 20/425* (2026.01); *H10W 20/033* (2026.01); *H10W 20/056* (2026.01); *H10W 20/062* (2026.01); *H10W 20/074* (2026.01)

(58) Field of Classification Search
None
See application file for complete search history.

(56) References Cited

U.S. PATENT DOCUMENTS

| | | | | |
|---|---|---|---|---|
| 9,105,490 | B2 | 8/2015 | Wang et al. | |
| 9,236,267 | B2 | 1/2016 | De et al. | |
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 * | 11/2017 | Lin | H10D 64/0112 |
| 9,859,386 | B2 | 1/2018 | Ho et al. | |
| 11,355,430 | B2 * | 6/2022 | Lo | H10W 20/072 |
| 2010/0093168 | A1 * | 4/2010 | Naik | H10W 20/072 438/618 |
| 2021/0057273 | A1 | 2/2021 | Chen et al. | |
| 2022/0310526 | A1 * | 9/2022 | Hsueh | H10W 20/42 |

(Continued)

FOREIGN PATENT DOCUMENTS

TW 202336974 A 9/2023

*Primary Examiner* — Bilkis Jahan
(74) *Attorney, Agent, or Firm* — NZ Carr Law Office

(57) ABSTRACT

An interconnect structure, along with methods of forming such, are described. The structure includes a dielectric layer, a conductive feature disposed in the dielectric layer, and a conductive layer disposed over the dielectric layer, wherein the conductive layer includes a first portion and a second portion adjacent the first portion. The structure also includes a first barrier layer in contact with the first portion of the conductive layer, a second barrier layer in contact with the second portion of the conductive layer, and a dielectric material disposed between and in contact with the first and second barrier layers, wherein a bottom surface of the second barrier layer and a bottom surface of the dielectric material are substantially co-planar.

20 Claims, 32 Drawing Sheets

(56) References Cited

U.S. PATENT DOCUMENTS

| | | | | |
|---|---|---|---|---|
| 2023/0062416 | A1* | 3/2023 | Wu | H10D 62/115 |
| 2023/0065583 | A1* | 3/2023 | Lo | H10W 20/063 |
| 2023/0066861 | A1* | 3/2023 | Lee | H10W 20/072 |
| 2023/0187300 | A1 | 6/2023 | Geiger et al. | |

* cited by examiner (Alternative Embodiment)

300
346
348
312t
338
318
328
306
344
342
320
340
334
312
310
304
Z
X 300
338
318
328
306
344
342
320
340
334
312
310
304
Z
X 700
346
348
312t
338
306
726
650
728
344
342
724
320
340
334
312
310
304
Z
X 700
338
306
726
650
728
344
342
724
320
340
334
312
310
304
Z
X

INTERCONNECT STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the aspect ratio of conductive features in the dielectric material in the back-end-of-line (BEOL) interconnect structure gets higher, electrical resistivity increase. Therefore, improved interconnect structures are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4D-1 is an enlarged view of a portion of the interconnect structure shown in FIG. 4D, in accordance with some embodiments.

FIG. 6G-1 is an enlarged view of a portion of the interconnect structure shown in FIG. 6G, in accordance with some embodiments.

FIG. 7P-1 is an enlarged view of a portion of the interconnect structure shown in FIG. 7P, in accordance with some embodiments.

DETAILED DESCRIPTION

Figure 1A:
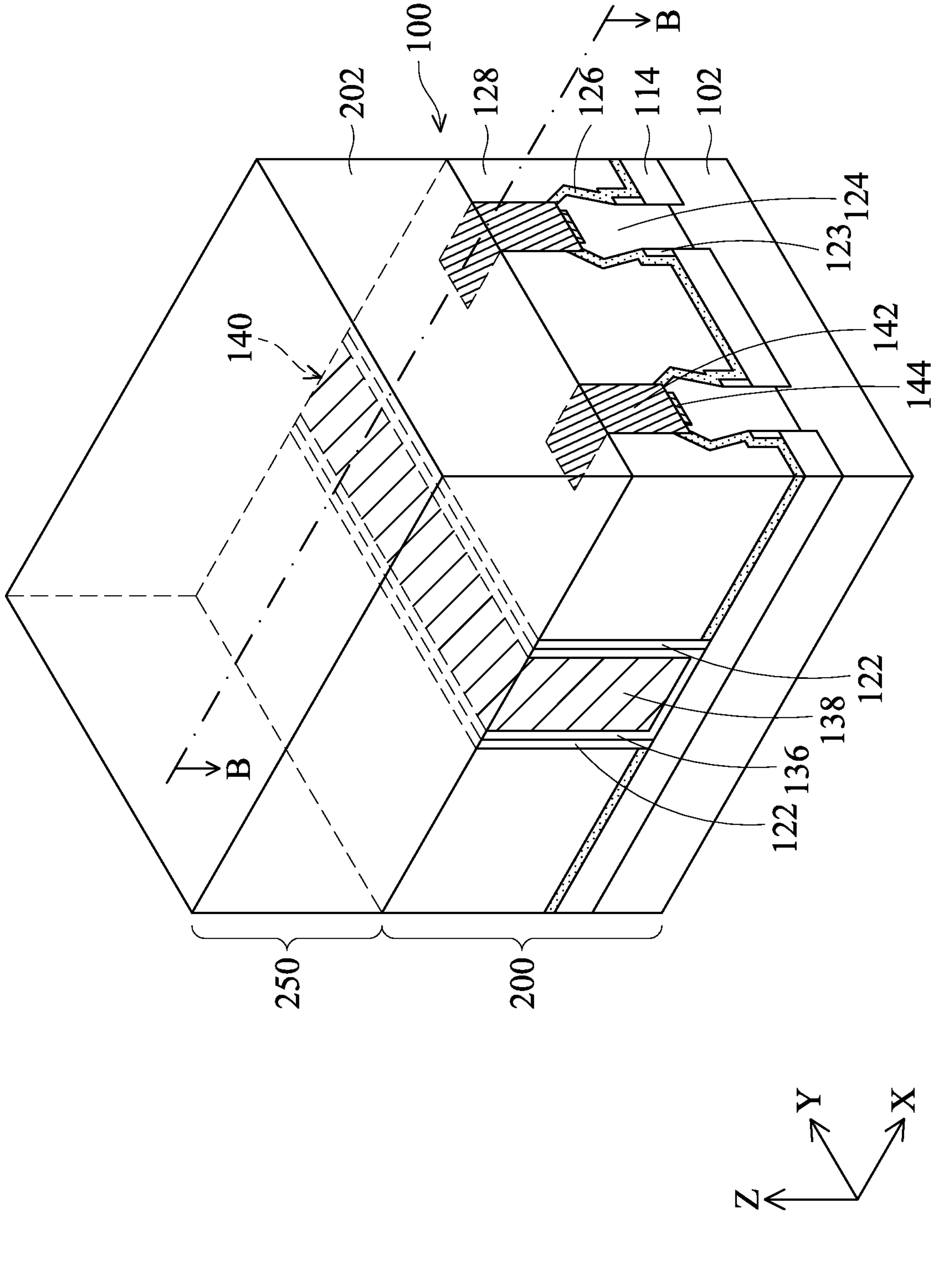
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
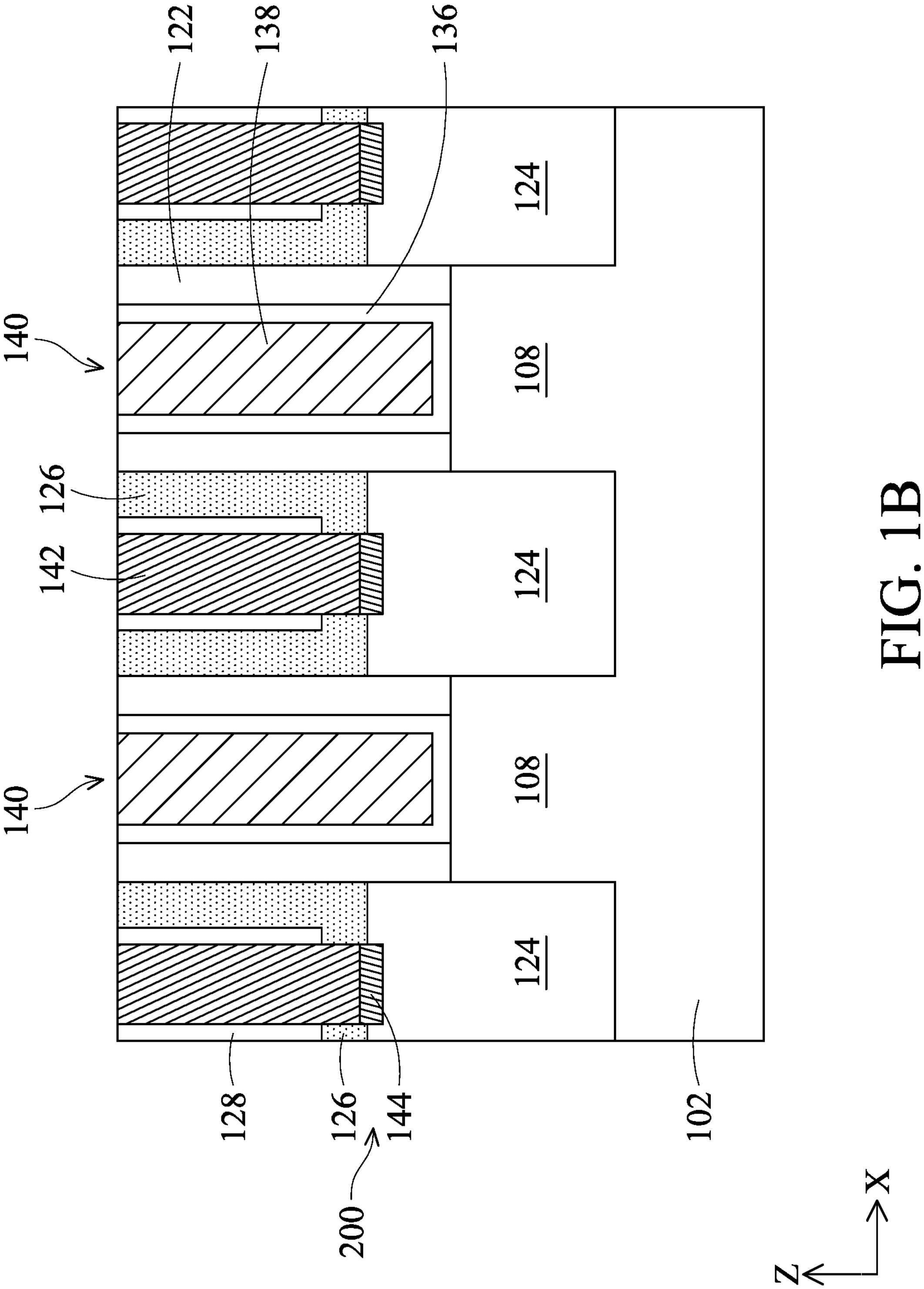
FIG. 1B is a cross-sectional side view of the stage of manufacturing the semiconductor device structure taken along line B-B of FIG. 1A, in accordance with some embodiments.

FIG. 1A illustrates a stage of manufacturing a semiconductor device structure 100 including a device layer 200 and an interconnect structure 250. FIG. 1B illustrates a cross-sectional view of the device layer 200 in accordance with some embodiments. The device layer 200 includes a substrate 102 and one or more devices formed in or on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the device layer 200 may include any suitable devices, such as transistors, diodes, imaging sensors, resistors, capacitors, inductors, memory cells, or a combination thereof. In some embodiments, the device layer 200 includes transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device formed on the substrate 102 is a FinFET, which is shown in FIGS. 1A and 1B. The device layer 200 includes source/drain (S/D) regions 124 and gate stacks 140 (only one is shown in FIG.

1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. While not shown, channel regions are formed between the S/D regions 124 and have at least three surfaces wrapped around by the gate stack 140.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions may include one or more semiconductor materials, such as Si, Ge, GeSn, SiGe, GaAs, InSb, GaP, GaSb, InAlAs, InGaAs, GaSbP, GaAsSb, GaN, GaP, or InP. The channel regions may include the same semiconductor material as the substrate 102. In some embodiments, the device layer 200 may include FinFETs, and the channel regions are a plurality of fins disposed below the gate stacks 140. In some embodiments, the device layer 200 may include nanostructure transistors, and the channel regions are surrounded by the gate stacks 140.

As shown in FIGS. 1A and 1B, each gate stack 140 includes a gate electrode layer 138 disposed over the channel region (or surrounding the channel region for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. The gate stack 140 may further include a gate dielectric layer 136 disposed over the channel region. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layer 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique. In some embodiments, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

A contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

S/D contacts 142 may be disposed in the ILD layer 128 and over the S/D region 124. The S/D contacts 142 may be electrically conductive and include a material having one or more of Ru, Mo, Co, Ni, W, Ti, Ta, Cu, Al, TiN or TaN, and the conductive contact may be formed by any suitable method, such as electro-chemical plating (ECP), or PVD. A silicide layer 144 may be disposed between the S/D contacts 142 and the S/D region 124. The silicide layers 144 may be made of a metal or metal alloy silicide, and the metal includes a noble metal, a refractory metal, a rare earth metal, alloys thereof, or combinations thereof.

In integrated circuits, interconnect structures (or interconnection structures) are used to provide signal routing and power supply to semiconductor devices. An integrated circuit chip typically includes a device layer, fabricated during front-end-of-line (FEOL) and middle-end-of-line (MEOL) processes, and a back-end-of-line (BEOL) layer. The device layer may be formed in and/or on the substrate, and the BEOL layer is formed on a front side and/or backside of the device layer. The device layer may include various semiconductor devices, such as transistors, diodes, capacitors, resistors, etc., and may be formed in and/or on the substrate. In some embodiments, the device layer may also include the MEOL structures, such as one or more dielectric layers with conductive features connected to gates and source/drain features in the device layer. Interconnect structures typically include conductive lines and vias formed in both the device layer and the BEOL layers.

Figure 2:
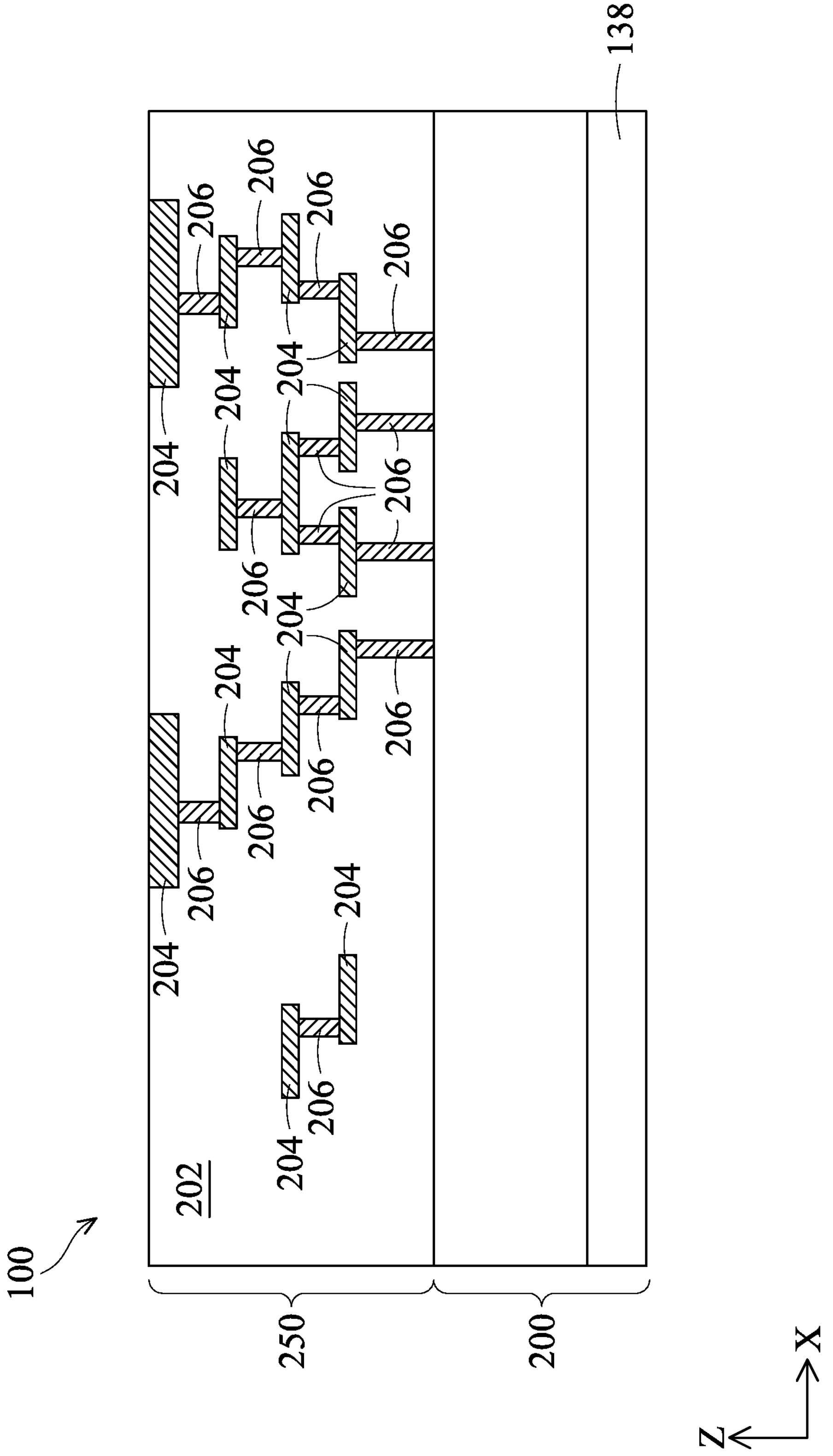
FIG. 2 is a cross-sectional side view of a stage of manufacturing the semiconductor device structure, in accordance with some embodiments.

FIG. 2 is a cross-sectional side view of a stage of manufacturing the semiconductor device structure 100, in accordance with some embodiments. The interconnect structure 250 is disposed over the device layer 200 and the substrate 102. The interconnect structure 250 includes various conductive features, such as a first plurality of conductive features 204 and second plurality of conductive features 206, and an intermetal dielectric (IMD) layer 202 to separate and isolate various conductive features 204, 206. In some embodiments, the first plurality of conductive features 204 are conductive lines and the second plurality of conductive features 206 are conductive vias. The interconnect structure 250 includes multiple levels of the conductive features 204, and the conductive features 204 are arranged in each level to provide electrical paths to the device layer 200 disposed below. The conductive features 206 provide vertical electrical routing from the device layer 200 to the conductive features 204 and between conductive features 204. For example, the bottom-most conductive features 206 of the interconnect structure 250 may be electrically connected to the conductive contacts disposed over the S/D regions 124 (FIGS. 1A and 1B) and the gate electrode layer 138 (FIGS. 1A and 1B). The conductive features 204 and conductive features 206 may be made from one or more electrically conductive materials, such as metal, metal alloy, metal nitride, or silicide. For example, the conductive features 204 and the conductive features 206 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. In some embodiments, a backside interconnect structure (not shown), similar to the interconnect structure 250, may be formed on the backside of the device layer 200 to provide power supply and/or additional signal connection to the device layer 200.

The IMD layer 202 includes one or more dielectric materials to provide isolation functions to various conductive features 204, 206. The IMD layer 202 may include multiple dielectric layers embedding multiple levels of conductive features 204, 206. The IMD layer 202 is made from a dielectric material, such as $SiO_x$, $SiO_xC_yH_z$, or $SiO_xC_y$, where x, y and z are integers or non-integers. In some embodiments, the IMD layer 202 includes a dielectric material having a k value ranging from about 1 to about 5.

Figure 3B:
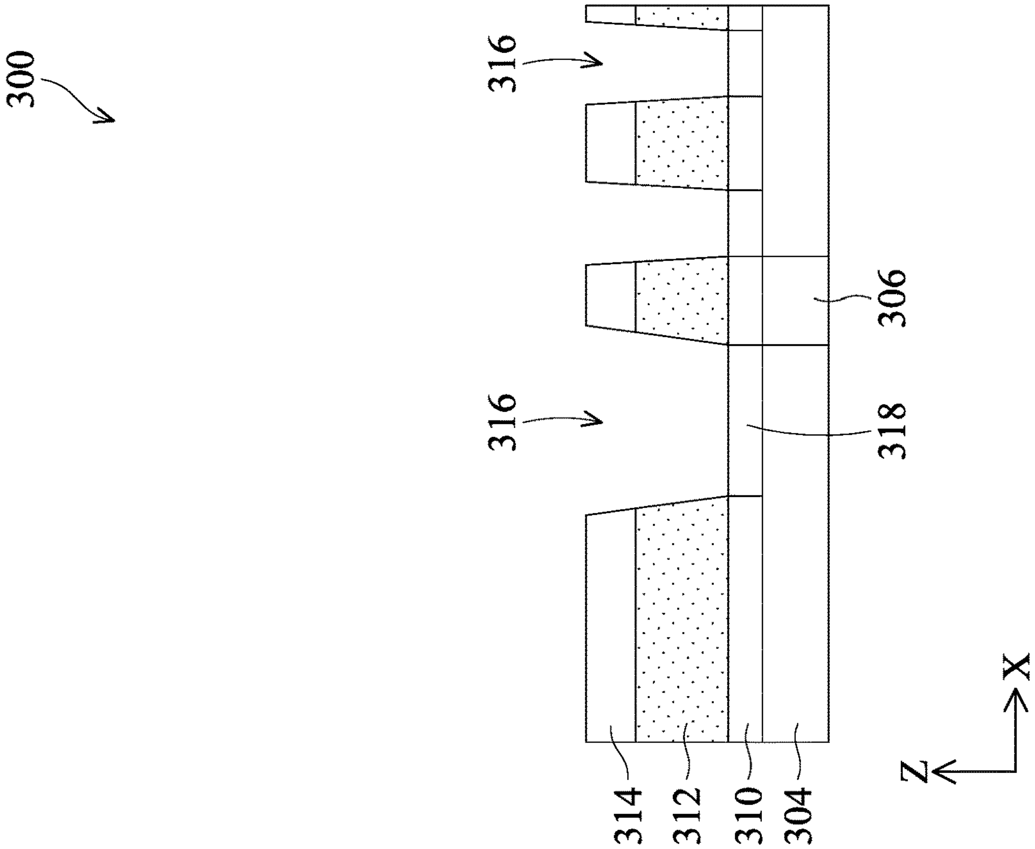
FIGS. 3A-3L are cross-sectional side views of various stages of manufacturing an interconnect structure, in accordance with some embodiments.
Figure 3A:
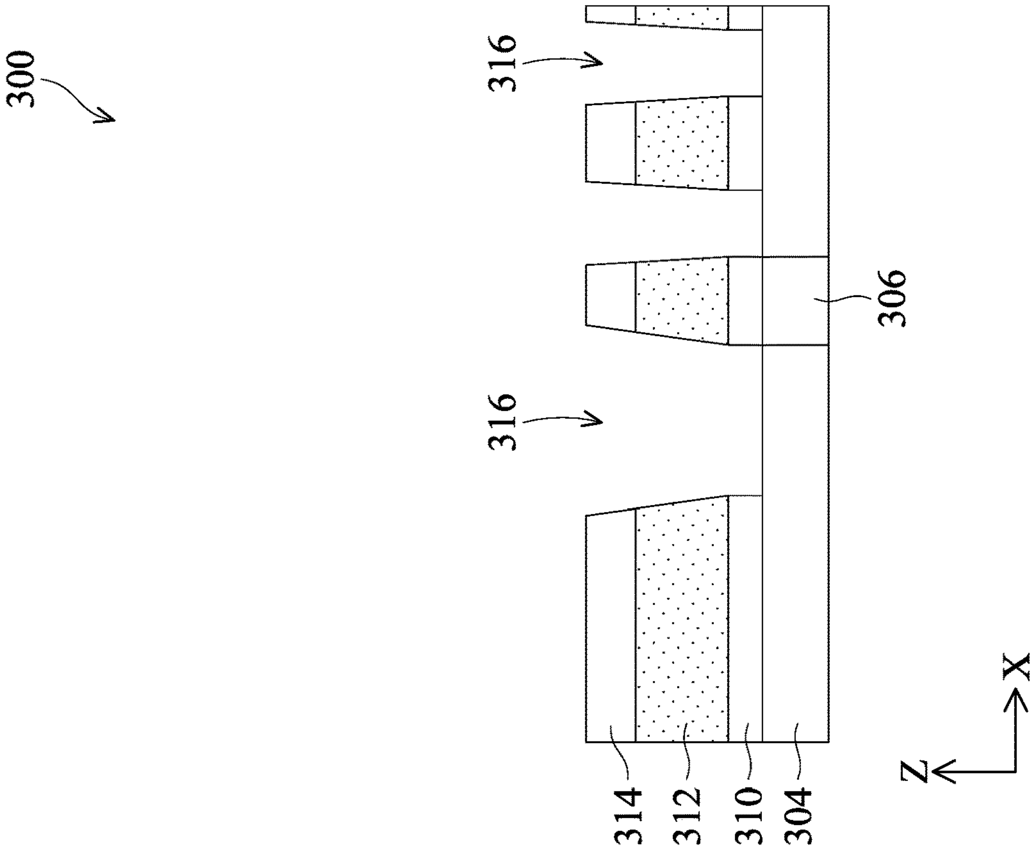

FIGS. 3A-3E are cross-sectional side views of various stages of manufacturing an interconnect structure 300, in accordance with some embodiments. The interconnect structure 300 may be used to form one or more layers of the interconnect structure 250 shown in FIGS. 1A and 1B as well as FIG. 2. As shown in FIG. 3A, the interconnect structure 300 includes a dielectric layer 304 and one or more conductive features 306 (only one is shown) disposed in the dielectric layer 304. The dielectric layer 304 may be an ILD layer or an intermetal dielectric (IMD) layer. For example, the dielectric layer 304 may be the ILD layer 128 (FIGS. 1A and 1B) or the IMD layer 202 (FIG. 2). An optional cap layer (not shown) may be disposed on each conductive feature 306. The dielectric layer 304 may include the same material as the ILD layer 128 or the IMD layer 202. In some embodiments, the dielectric layer 304 includes a low-k dielectric material having a k value ranging from about 1.5 to about 3.9. In some embodiments, the dielectric layer 304 includes silicon oxide. In some embodiments, the dielectric material 304 includes SiOCH. The dielectric layer 304 may be formed by chemical vapor deposition (CVD), atomic layer deposition (ALD), spin coating, or other suitable process.

The conductive feature 306 and the cap layer (if used) may each include an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 306 and the cap layer 308 each includes a metal. The conductive feature 306 and the cap layer (if used) may be formed by physical vapor deposition (PVD), CVD, ALD, or other suitable process. In some embodiments, the conductive feature 306 may have a thickness ranging from about 50 Angstroms to about 500 Angstroms, and the cap layer (if used) may have a thickness ranging from about 2 Angstroms to about 50 Angstroms. The conductive features 306 may be electrically connected to corresponding S/D regions 124 (FIGS. 1A and 1B) and/or the gate electrode layer 138 (FIGS. 1A and 1B). In some embodiments, the conductive feature 306 may be the conductive contact disposed in the ILD layer 128 or the conductive feature 204, 206 disposed in the IMD layer 202. For example, the conductive features 306 may be conductive lines or conductive vias as shown in FIG. 2. In some embodiments, the conductive feature 306 may include a barrier layer (not shown) disposed between the dielectric layer 306 and the electrically conductive material of the conductive feature 306. The barrier layer may include an electrically conductive material, such as a metal or metal nitride.

Still referring to FIG. 3A, a glue layer 310, a conductive layer 312, and a hard mask 314 are formed over the dielectric layer 304. In some embodiment, the glue layer 310 is formed on the dielectric layer 302, the conductive layer 312 is formed on the glue layer 310, and the hard mask 314 is formed on the conductive layer 312. In some embodiments, the glue layer 310 is not present, and the conductive layer 312 is formed on the dielectric layer 304. The glue layer 310 may include a nitride, such as a metal nitride, and may be formed by PVD, CVD, ALD, or other suitable process. In some embodiments, the glue layer 310 includes TiN or TaN. The glue layer 310 may have a thickness ranging from about 2 Angstroms to about 100 Angstroms. The glue layer 310 may provide adhesion between the conductive layer 312 and the cap layer (if used) or the conductive feature 306. The conductive layer 312 may include the same material as the conductive feature 306 and may be formed by the same process as the conductive feature 306. The conductive layer 312 may have the same thickness as the conductive feature 306. The hard mask 314 may include SiN, SiON, $SiO_2$, the like, or a combination thereof, and may be formed by CVD, PVD, ALD, spin coating, or other suitable process. In one exemplary embodiment, the hard mask 314 is SiN.

Thereafter, openings 316 are formed in the hard mask 314, the conductive layer 312, and the glue layer 310. Openings 316 may be formed by first patterning the hard mask 314, followed by transferring the pattern of the hard mask 314 to the conductive layer 312 and the glue layer 310. The openings 316 may be formed by any suitable process, such as wet etch, dry etch, or a combination thereof. In some embodiments, the openings 316 are formed by one or more etch processes. The openings 316 separate the conductive layer 312 into one or more portions, such as a plurality of portions. Depending on the layout, the openings 316 may have a width different from each other. In some embodiments, each portion of the conductive layer 312 is a conductive feature, such as a conductive line.

In FIG. 3B, a first blocking layer 318 is selectively formed on the dielectric layer 304. The first blocking layer 318 may be a self-assembled monolayers (SAMs) having a head group and a tail group. The head group of the SAM may be selected so that it does not form on the hard mask 314, conductive layer 312 and the glue layer 310. The tail group of the SAM may be selected so that it blocks adsorption of a precursor (e.g., precursor for forming the subsequent barrier layer 320, FIG. 3C) from forming on the first blocking layer 318. Suitable materials for the first blocking layer 318 may include organic such as 3-aminopropyl) triethoxysilane, N-(3-Triethoxysilylpropyl)ethylenediamine, 2-(diphenyl-phosphino)ethyltriethoxy-silane, 2-cyanoethyltriethoxysilane, (3-Mercaptopropyl)triethoxysilane, N-[3-(diethoxymethylsilyl) propyl]ethylenediamine, diethyl [2-(diethoxymethylsilyl)ethyl]phosphonate, and 3-(2-Pyridylethyl) thiopropyltrimethoxysilane. The first blocking layer 318 may be formed by a wet-coating process, and the solution for wet coating may be a protic organic solvent such as alcohols, carboxylic acids, or a combination thereof. Exemplary protic organic solvents may include, but are not limited to, methanol, ethanol, 1-propanol, 2-propanol, 1-butanol, 1-pentanol, 1-hexanol, 1-heptanol, 2-ethoxyethanol, and mixtures thereof. The solution for wet coating may also be a polar or nonpolar protic solvent. Exemplary polar aprotic solvents may include, but are not limited to, N,N-dimethylformamide, N-methyl-2-pyrrolidinone, acetonitrile, acetone, ethyl acetate, benzyl ether, trioctylphosphine, trioctylphosphine oxide, and mixtures thereof. Exemplary nonpolar protic solvents may include, but are not limited to, alkane, olefin, an aromatic, an ester or an ether solvent, hexane, octane, benzene, toluene, xylene, and mixtures thereof.

Other material, such as a compound having a silicon or carbon end group may also be used to bond with the exposed surfaces of the dielectric layer 304. In such embodiments, the first blocking layer 318 may include butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl) silane, methoxy (dimethyl) octadecylsilane, methoxy (dimethyl)-n-octylsilane, octadecyltriethoxysilane, triethoxy-n-octylsilane, octadecyltrimethoxysilane, trimethoxy (propyl) silane, trimethoxy-n-octylsilane, triethoxy (propyl) silane, methane, ethane, propane, butane, pentane, hexane, heptane, octane, nonane, decane, undecane, dodecane, pentadecane, hexadecane, or other suitable compound. In such cases, the first blocking layer 318 may be formed by ALD, CVD, spin-on, dipping, radical reaction through remote plasma, or other suitable process. The first blocking layer 318 may have a thickness ranging from about 1 Angstrom to about 30 Angstroms.

Figures 1, 3B:
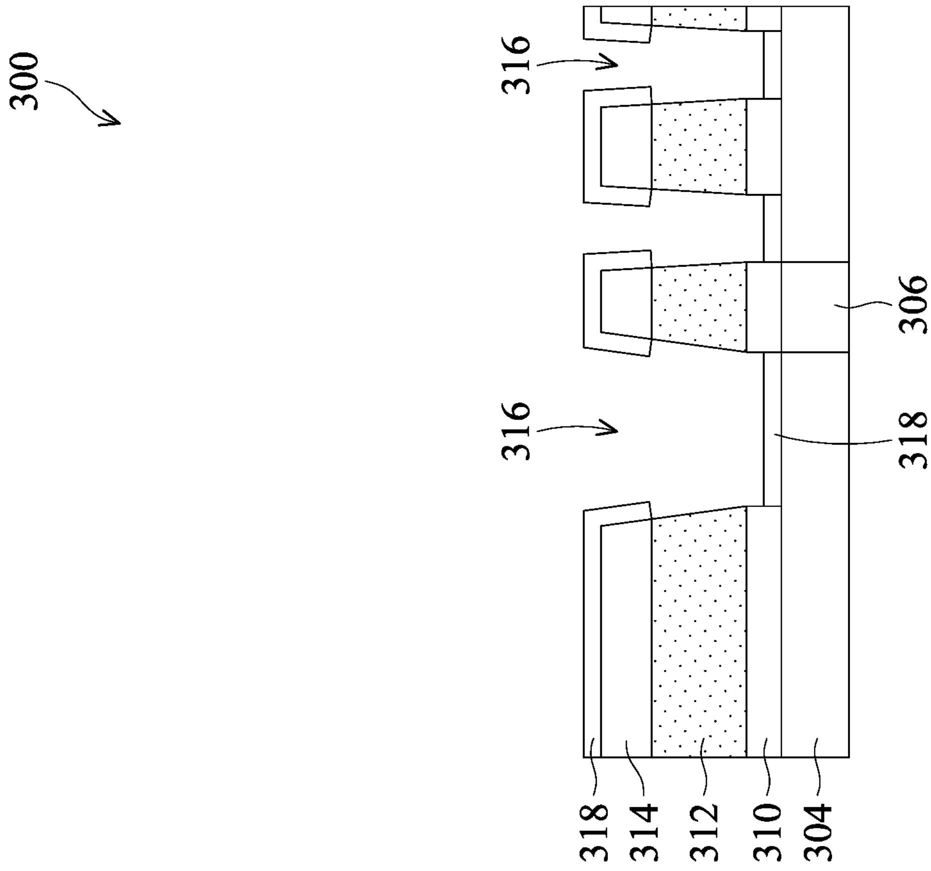

In some alternative embodiments where the hard mask 314 and the dielectric layer 304 are formed of the same material (e.g., $SiO_x$), a treatment process may be performed to activate the dielectric surfaces of the hard mask 314 and the dielectric layer 304 in the openings 316. The treatment process may be a plasma treatment process utilizing process gases such as hydrogen gas, ammonia, and/or oxygen-containing gas. The oxygen-containing gas may include oxygen gas, carbon dioxide, or other suitable oxygen-containing gas. The first blocking layer 318 is then formed on the activated dielectric surfaces of the hard mask 314 and the dielectric layer 304. This allows the subsequent barrier layer 320 (FIG. 3C) to deposit on the exposed conductive surfaces of the conductive layer 312 and the glue layer 310, as shown in FIG. 3B-1.

Figure 3C:
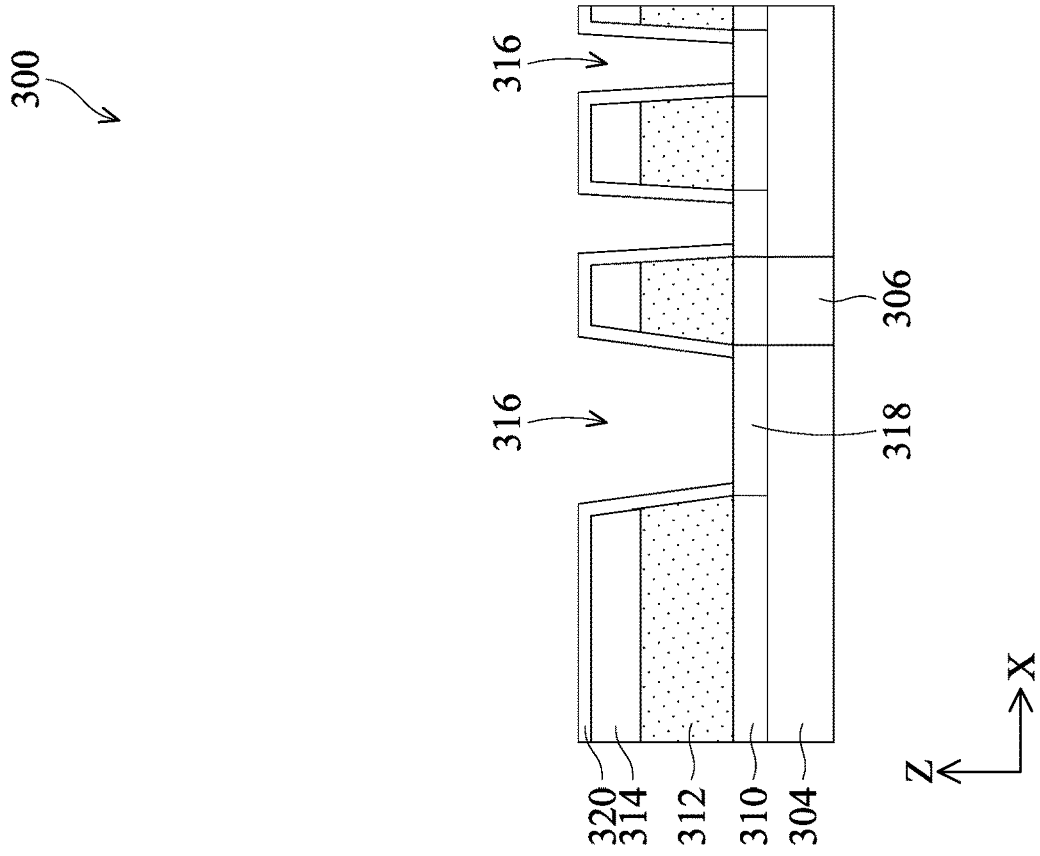

In FIG. 3C, a barrier layer 320 is formed on the exposed surfaces of the hard mask 314, the conductive layer 312 and the glue layer 310 in each opening 316. The barrier layer 320 may be selectively formed on the exposed surfaces of the mask layer 314, the conductive layer 312, and the glue layer 310 but not on the first blocking layer 318. In other words, the first blocking layer 318 blocks the barrier layer 320 from forming on the dielectric layer 304. Depending on the thickness of the barrier layer 320, the glue layer 310 may or may not be revealed for the barrier layer 320 to deposit on in some cases. The barrier layer 320 may include a nitride, such as a metal nitride. In some embodiments, the barrier layer 320 includes a refractory metal nitride, such as TiN or TaN. Other metallic material, such as a metal oxide (e.g., $RuO_2$), may also be used. The selective deposition of the barrier layer 320 can be achieved and/or enhanced through the use of ALD process and/or MLD process so that the barrier layer 320 has the characteristic or property of being specific in bonding with the exposed surfaces of the hard mask 314, the conductive layer 312, and the glue layer 310 through self-limiting surface reactions. Because the portions of metal like barrier layer 320 formed on adjacent portions of the conductive layer 312 are not connected, time dependent dielectric breakdown (TDDB) failure due to line to line leakage, i.e., leakage between adjacent portions of the conductive layer 312, is reduced. In addition, the use of the first blocking layer 318 as the barrier layer between the dielectric layer 304 and the subsequent dielectric material 328 also helps reduce the overall K value of the interconnect structure 300 and the chances of TDDB failure due to poor barrier properties associated with the barrier layer using a dielectric material. The barrier layer 320 may have a thickness ranging from about 3 Angstrom to about 20 Angstroms.

Figure 3D:
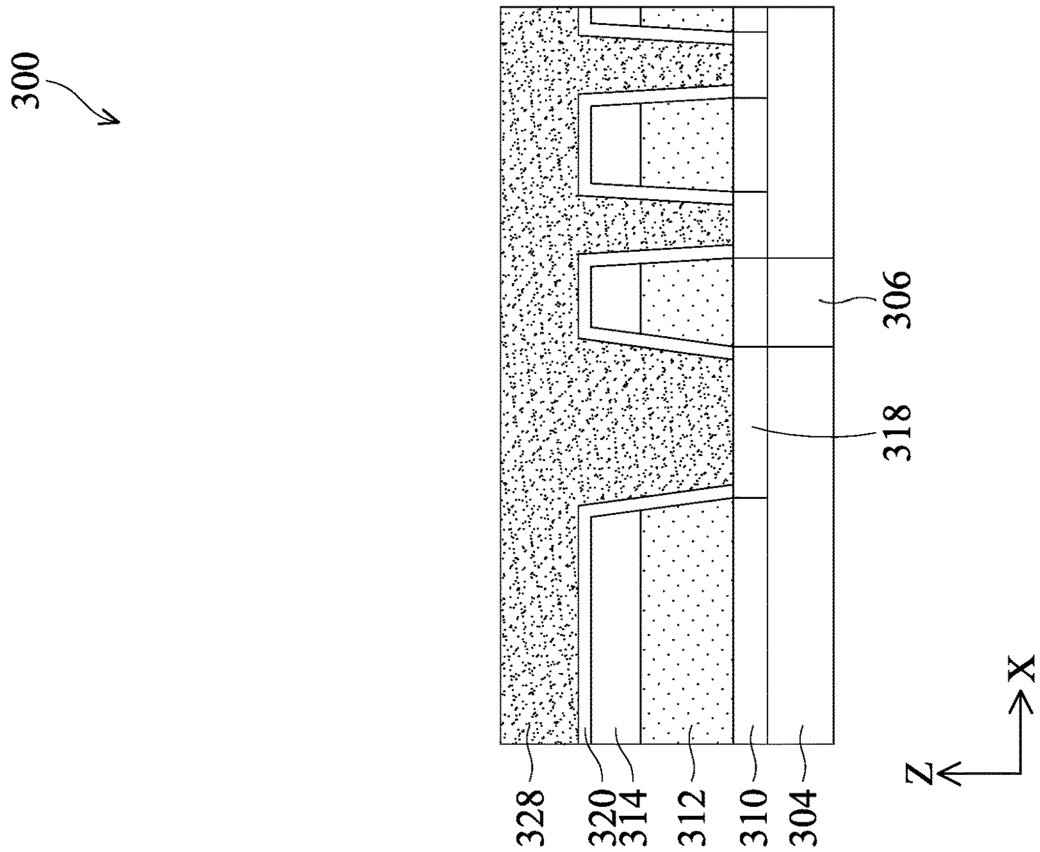

In FIG. 3D, after the formation of the barrier layer 320, a dielectric material 328 is formed on the barrier layer 320 and the first blocking layer 318. The dielectric material 328 may be a silicon-containing material, such as SiOC, $SiO_x$, SiCN, SiN, SiCON, SiC, or SiON. In some embodiments, the dielectric material 328 includes a low-k dielectric material, such as SiCOH, having a k value ranging from about 2 to about 3.6. The low-k dielectric material may have a porosity ranging from about 0.1 percent to about 40 percent. The dielectric material 328 may fill the openings 316 (FIG. 3C) and over the hard mask 314 until a desired height is achieved. The dielectric material 328 may be formed by FCVD, CVD, ALD, PVD, PECVD, PEALD, or other suitable process.

Figure 3F:
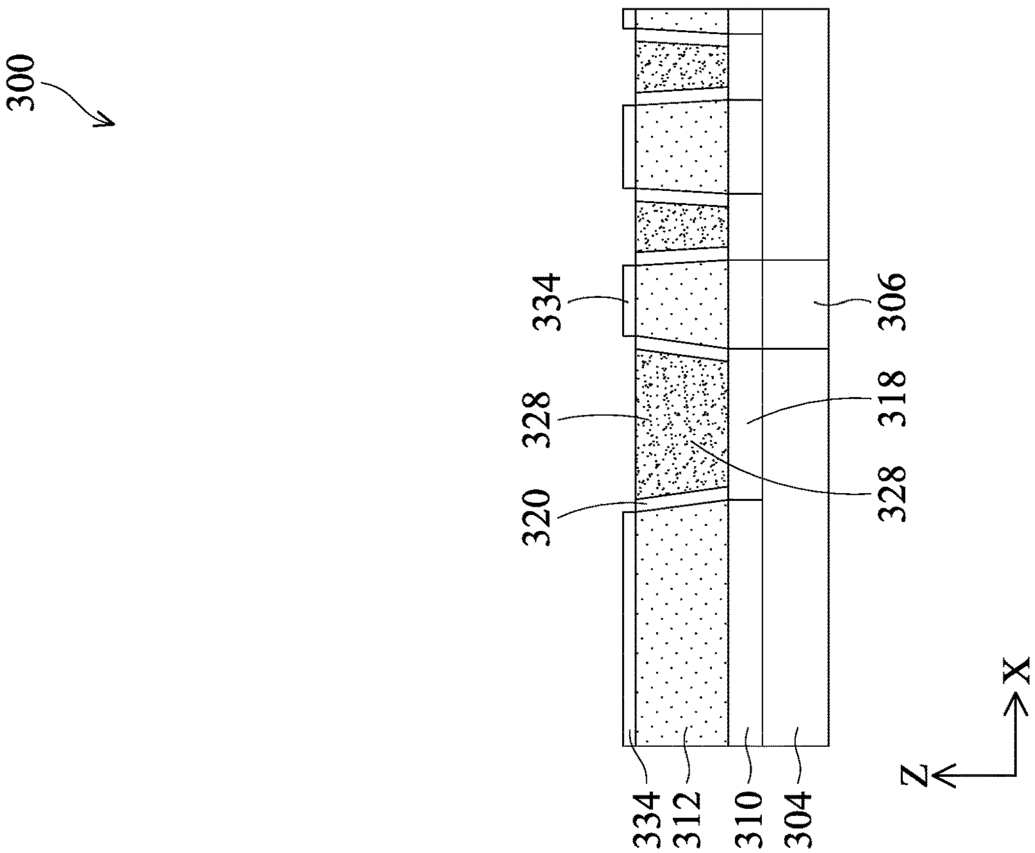
Figure 3E:
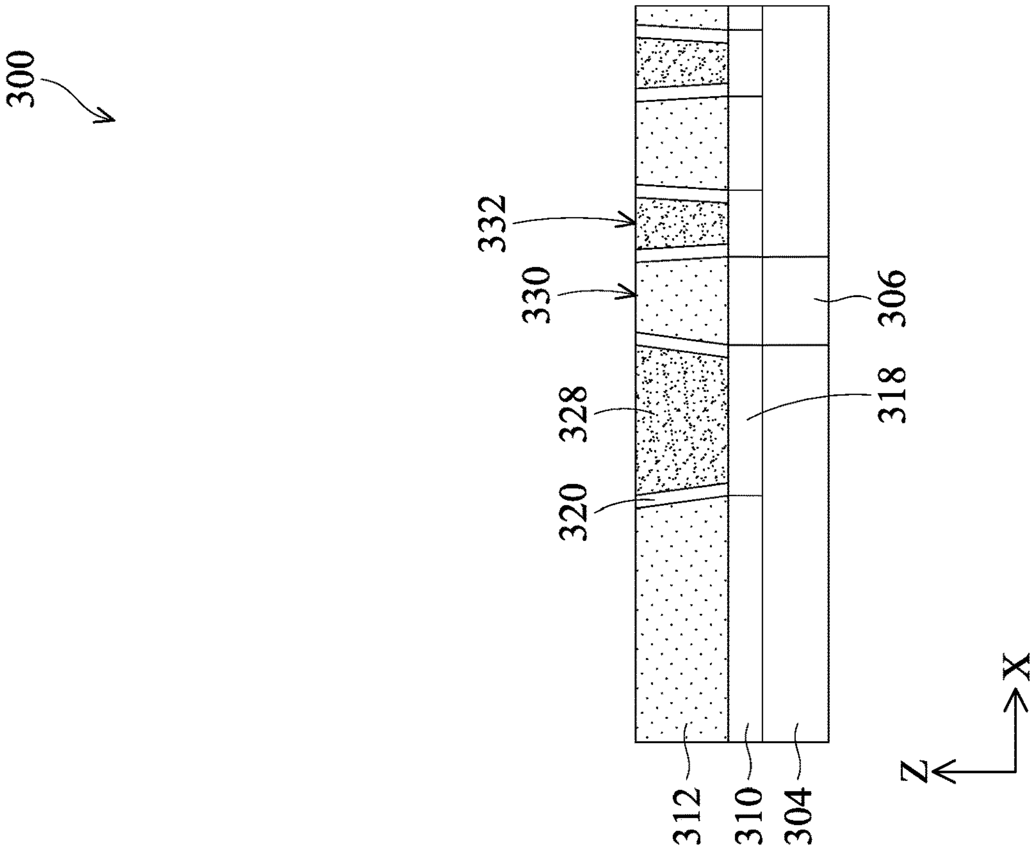

In FIG. 3E, a planarization process is performed to remove a portion of the dielectric material 328, the barrier layer 320, and the hard mask 314. The planarization process may be performed until the conductive layer 312 is exposed. The barrier layer 320 disposed on the sidewall of the hard mask 314 may be also removed as a result of the planarization process. The planarization process may be any suitable process, such as a chemical-mechanical polishing (CMP) process. As a result of the planarization process, a top surface 330 of the conductive layer 312 may be substantially co-planar with a top surface 332 of the dielectric material 328. In addition, a bottom of the barrier layer 320, a bottom of the dielectric material 328, and a top surface of the first blocking layer 318 are substantially co-planar. Depending on the height of the openings 316, the remaining dielectric material 328 may have a thickness ranging from about 2 Angstroms to about 1000 Angstroms. The dielectric material 328 protects the first blocking layer 318 during the planarization process.

In cases where the alternative embodiment shown in FIG. 3B-1 was adapted, the barrier layer 320 is selectively deposited on the exposed surfaces of the conductive layer 312 and the glue layer 310 (if revealed). After the dielectric material 328 is formed, the planarization process is performed until the conductive layer 312 is exposed, resulting in the interconnect structure 300 that is substantially identical to the embodiment shown in FIG. 3E.

In FIG. 3F, after the planarization process, a cap layer 334 may be selectively formed on the top surface 330 of the conductive layer 312. The cap layer 334 may each include an electrically conductive material, such as Cu, Co, Ru, Mo, Cr, W, Mn, Rh, Ir, Ni, Pd, Pt, Ag, Au, Al, alloys thereof, or other suitable material. In some embodiments, the cap layer 334 each includes a metal. The cap layer 334 may be formed by PVD, CVD, ALD, or other suitable process. In some embodiments, the cap layer 334 has a thickness ranging from about 2 Angstroms to about 50 Angstroms. The cap layer 334 may be selectively formed on the top surface 330, which may be metallic, but not on the top surface 332 of the dielectric material 328.

Figure 3G:
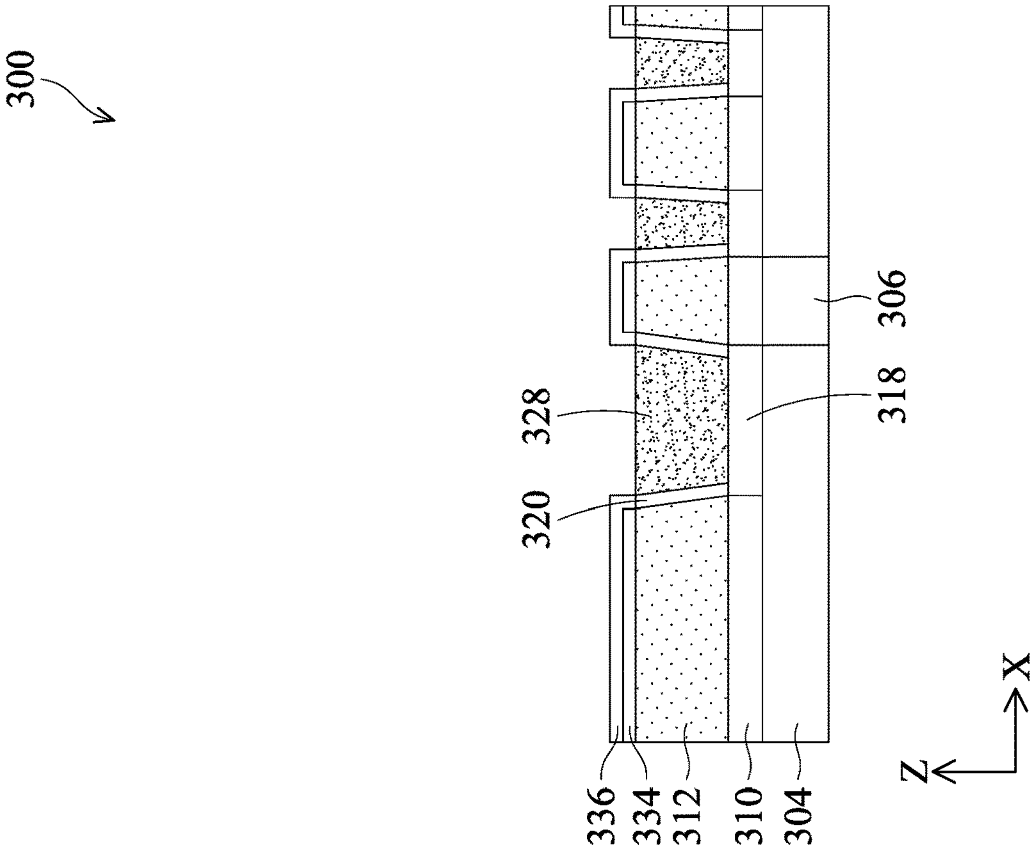

In FIG. 3G, a treatment process may be performed to activate the metallic surfaces of the cap layer 334 and the barrier layer 320. The treatment process may be a plasma treatment process utilizing process gases such as hydrogen gas, ammonia, and/or oxygen-containing gas. The oxygen-containing gas may include oxygen gas, carbon dioxide, or other suitable oxygen-containing gas. After the treatment process, a second blocking layer 336 is formed on the activated metallic surfaces of the cap layers 334 and the barrier layer 320.

The second blocking layer 336 may include one or more self-assembled monolayers (SAMs) having a head group and a tail group. The head group of the SAM may be selected depending on the material of the cap layer 334. In some embodiments, the head group of the SAM may include a phosphorus (P), sulfur(S), silicon (Si), or nitrogen (N) terminated compound which may only attach to the treated metallic surfaces of the cap layer 334. The head group of the SAM may not form on the dielectric surface of the dielectric layer 328. The tail group of the SAM may include a highly hydrophobic long alkyl chain which blocks adsorption of a precursor (e.g., precursor for forming the subsequent metal oxide layer 338) from forming on the second blocking layer 336. In some embodiments, the tail group includes a polymer such as polyimide. The second blocking layer 336 may be formed by supplying a blocking agent to the exposed surfaces, for example by CVD, ALD, molecular layer deposition (MLD), wet coating, immersion process, or other suitable methods. The second blocking layer 336 may have a thickness ranging from about 1 Angstrom to about 50 Angstroms.

In some embodiments, the second blocking layer 336 includes 1-octadecanethiol, 1-dodecanethiol, stearic acid, 4-dodecylbenzenesulfonic acid, dimethyl octadecylphosphonate, bi (dodecyl) dithiophosphinic acids, bi (octadecyl) dithiophosphinic acids, diethyl-n-octadecylphosphonate, octadecylphosphonic acid, decylphosphonic acid, tetradecylphosphonic acid, 2-mercaptobenzothiazole, 2-mercaptobenzoxazole, 2-mercaptobenzimidazole, benzothiazol, benzoxazole, benzimidazole, 2-methylbenzimidazole, 5,6-dimethylbenzimidazole, 2-(methylthio)benzimidazole, 1,2,3-triazole, 1,2,4-triazole, 3-amino-1,2,4-triazole, 1-hydroxybenzotriazole hydrate, 4-methyl-1H-benzotriazole, 5-methyl-1H-benzotriazole, 5,6-dimethyl-1H-benzotriazole, 4-hydroxy-1H-benzotriazole, benzotriazole-1-carboxamide, 2-methylbenzothiazole, imidazole, methimazole, 5-phenyl-1H-tetrazole, benzotriazole, 5-(3-aminophenyl)tetrazole, 4-amino-4H-1,2,4-triazole, 3-amino-5-mercapto-1,2,4-triazole, 3-amino-5-methylthio-1H-1,2,4-triazole, 2-aminopyrimidine, 2-mercaptopyrimidine, adenine, hypoxanthine, morpholine, 5-amino-1,3,4-thiadiazole-2-thiol, tryptophan, histidine, 5-(trifluoromethyl)-1H-1,2,3-benzotriazole, 1H-benzotriazole, 1-(4-morpholinylmethyl), phenothiazine, purine, melamine, trithiocyanuric acid, 1,3,4-thiadiazole-2,5-diamine, 3,5-diamino-1,2,4-triazole, 5-aminotetrazole, 3,6-bis(methylthio)-1,2,4,5-tetrazine, aminophylline, or other suitable compound.

Figure 3H:
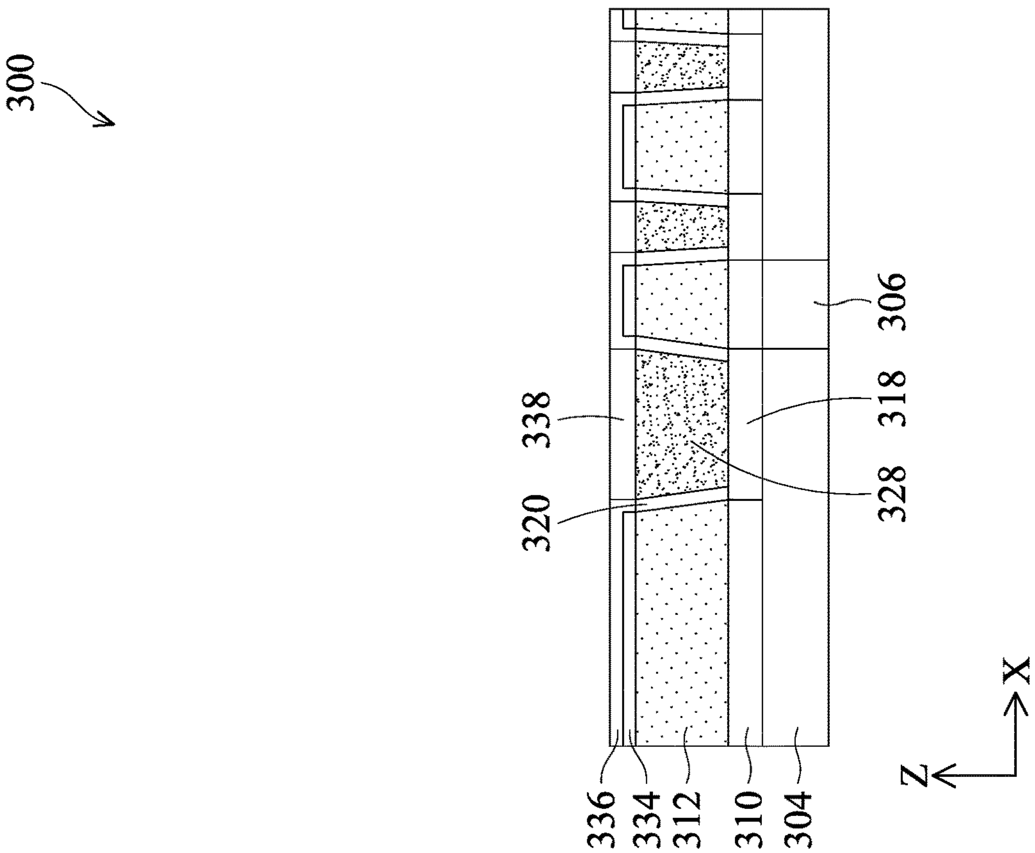

In FIG. 3H, an optional metal oxide layer 338 is formed on the exposed top surfaces 332 (FIG. 3E) of the dielectric material 328. The metal oxide layer 338 may be selectively formed on the exposed dielectric surfaces of the dielectric material 328 but not on the second blocking layer 336. In other words, the second blocking layer 336 blocks the metal oxide layer 338 from forming on the metallic surfaces of the cap layer 334. The second blocking layer 336 blocks the precursor(s) of the metal oxide layer 338 from forming thereon, so the precursor(s) of the metal oxide layer 338 grows on the dielectric surfaces, such as the dielectric material 328. The metal oxide layer 338 may include a metal, such as Al, Ti, Zr, Hf, Y, or other suitable metal. The metal oxide layer 338 may be formed by any suitable process, such as CVD, ALD, or spin-on. The metal oxide layer 338 extends above the level of the top surface of the portions of the conductive layer 312. The metal oxide layer 338 may have a thickness ranging from about 20 Angstroms to about 100 Angstroms. The metal oxide layer 338 prevents a subsequently formed conductive feature 350 (FIG. 3K) from entering between the neighboring portions of the conductive layer 312 as a result of an edge placement error (EPE). Thus, if the thickness of the metal oxide layer 338 is less than about 20 Angstroms, the metal oxide layer 338 may not be sufficient to prevent the conductive feature 350 (FIG. 3K) from entering between the neighboring portions of the conductive layer 312. On the other hand, if the thickness of the metal oxide layer 338 is greater than about 100 Angstroms, manufacturing cost is increased without significant advantage.

Figure 3J:
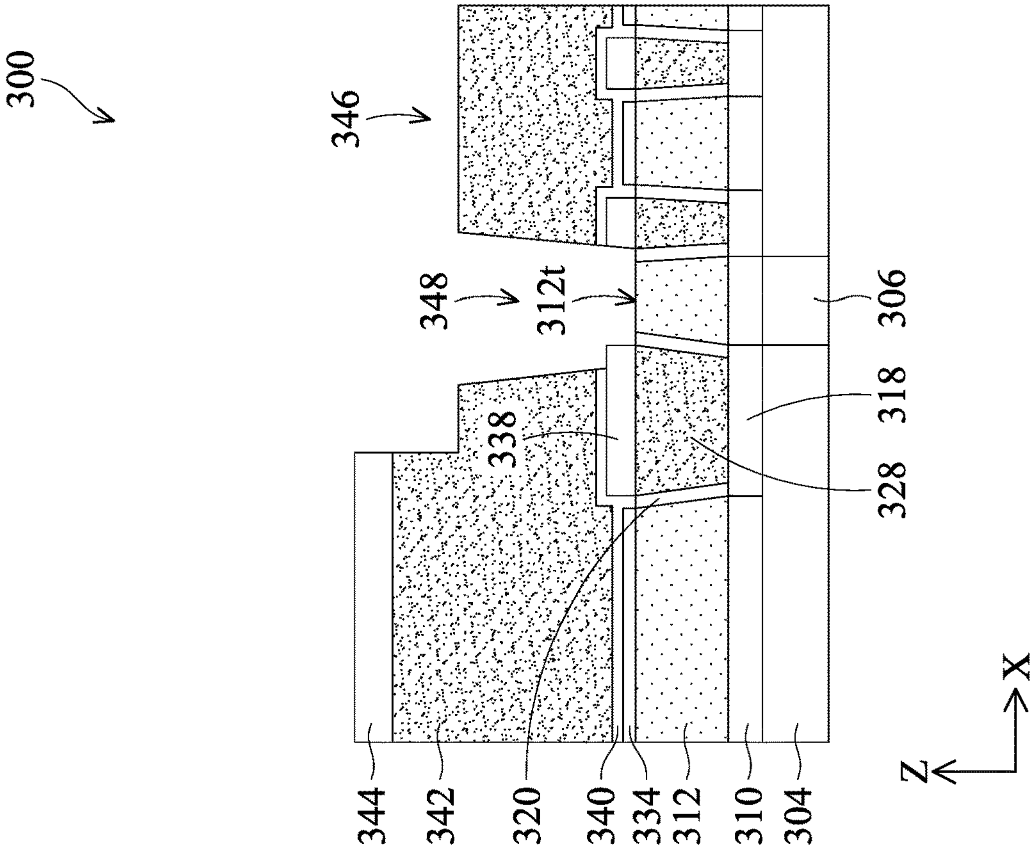
Figure 3I:
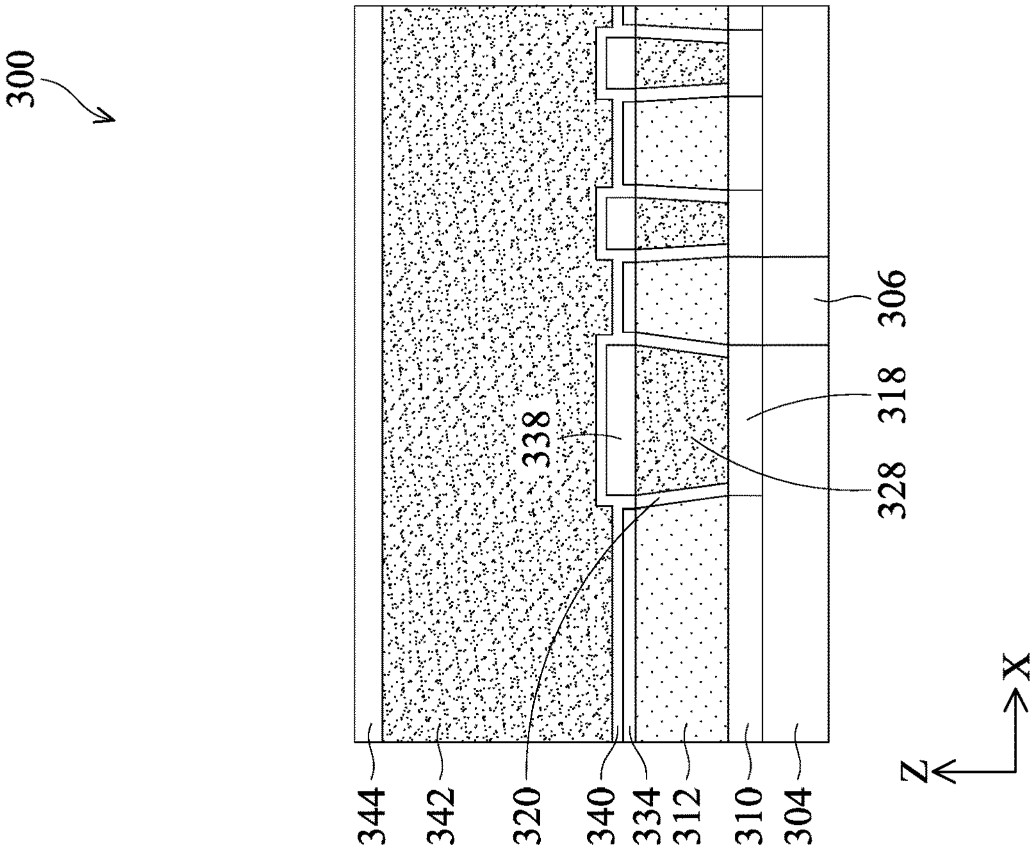

In FIG. 3I, the second blocking layer 336 is removed. The removal of the second blocking layer 336 may be performed by any suitable process, such as plasma treatment, thermal treatment, or selective plasma etching. The metal oxide layer 338 has a top surface that may be at a level higher than a top surface of the cap layer 334.

Next, an etch stop layer 340 is formed on the top surface 339 of the metal oxide layer 338 and on the top surface of the cap layer 334. A portion of the etch stop layer 340 is also formed on the top surface of the barrier layer 320. The etch stop layer 340 may be a single layer or a multi-layer structure. In some embodiments, the etch stop layer 340 may be an oxide, such as a metal oxide. For example, the etch stop layer 340 may include Al, Zr, Y, Hf, or other suitable metal. In some embodiments, the etch stop layer 340 includes a silicon-containing material, such as SiCO, SiCN, SiN, SiCON, $SiO_x$, SiC, SiON, or other suitable material. The etch stop layer 340 may include a material different from the metal oxide layer 338 in order to have different etch selectivity compared to the metal oxide layer 338. The etch stop layer 340 may be formed by any suitable process, such as CVD, ALD, spin-on, or any conformal deposition process. The etch stop layer 340 may have a thickness ranging from about 1 Angstrom to about 100 Angstroms.

A dielectric material 342 is then formed on the etch stop layer 340, and a hard mask 344 is formed on the dielectric material 342. The dielectric material 342 may include the same material as the dielectric material 328 and may be formed by the same process as the dielectric material 328. The etch stop layer 340 and the dielectric material 342 may have different etch selectivity, and the metal oxide layer 338 and the dielectric material 342 may have different etch selectivity. The hard mask 344 may include the same material as the hard mask 314 and may be formed by the same process as the hard mask 314. An optional etch stop layer (not shown) may be embedded in the dielectric material 342.

In FIG. 3J, openings 346, 348 are formed in the hard mask 344 and the dielectric material 342. The openings 346, 348 may be a result of a dual-damascene process. For example, the opening 346 may be first formed by patterning the hard mask 344 and transferring the pattern to a portion of the dielectric material 342. The optional etch stop layer (not shown) embedded in the dielectric material 342 may be utilized in forming the opening 346. The opening 348 is then formed by covering a portion of a bottom of the opening 346. Thus, the opening 348 has smaller dimensions than the opening 346. In some embodiments, the opening 348 is a via and the opening 346 is a trench. The openings 346, 348 may be formed by any suitable processes, such as one or more etch processes. The etch processes also remove a portion of the etch stop layer 340 and the cap layer 334, so the opening 348 exposes a top surface 313 of a portion of the conductive layer 312.

In some embodiments, opening 348 is aligned with a portion of the conductive layer 312, such as the portion of the conductive layer 312 disposed between two dielectric materials 328. In some embodiments, the opening 348 may be slightly misaligned with the portion of the conductive layer 312, and a portion of the metal oxide layer 338 is exposed. The misalignment of the via is known as an edge placement error (EPE). If the metal oxide layer 338 is not present, the opening 348 may be also formed in the dielectric material 328, because the dielectric material 342 and the dielectric material 328 may include the same material. As a result, subsequently formed conductive feature may be formed in the dielectric material 328 between the neighboring portions of the conductive layer 312, which may cause line to line leakage. Reliability issues such as poor breakdown voltage or time dependent dielectric breakdown may occur as a result of the line to line leakage. With the metal oxide layer 338 disposed on the dielectric material 328, the etch processes utilized to form the opening 348 do not substantially affect the metal oxide layer 338 due to its different etch selectivity compared to the dielectric material 342 and the etch stop layer 340. In addition, as described above, the metal oxide layer 338 extends above the level of the top surface of the portions of the conductive layer 312 and has a thickness ranging from about 20 Angstroms to about 100 Angstroms. Thus, even if the etch processes utilized to form the opening 348 remove some of the metal oxide layer 338, the opening 348 would not be formed in the dielectric material 328 due to the thickness of the metal oxide layer 338. Therefore, with the metal oxide layer 338, the risk of line to line leakage is reduced when EPE occurs. Furthermore, the use of the ALD metal like barrier 320 helps further reduce the chances of TDDB failure due to poor barrier properties associated with the barrier layer using a dielectric material.

Figure 3L:
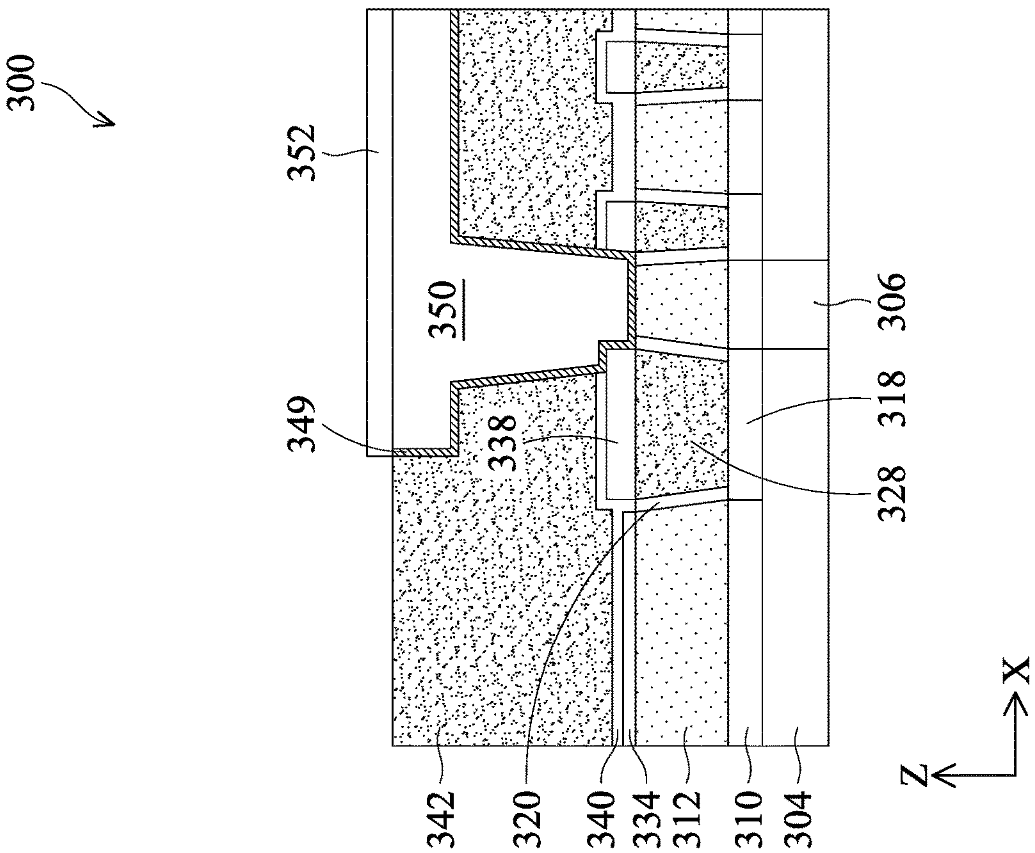
Figure 3K:
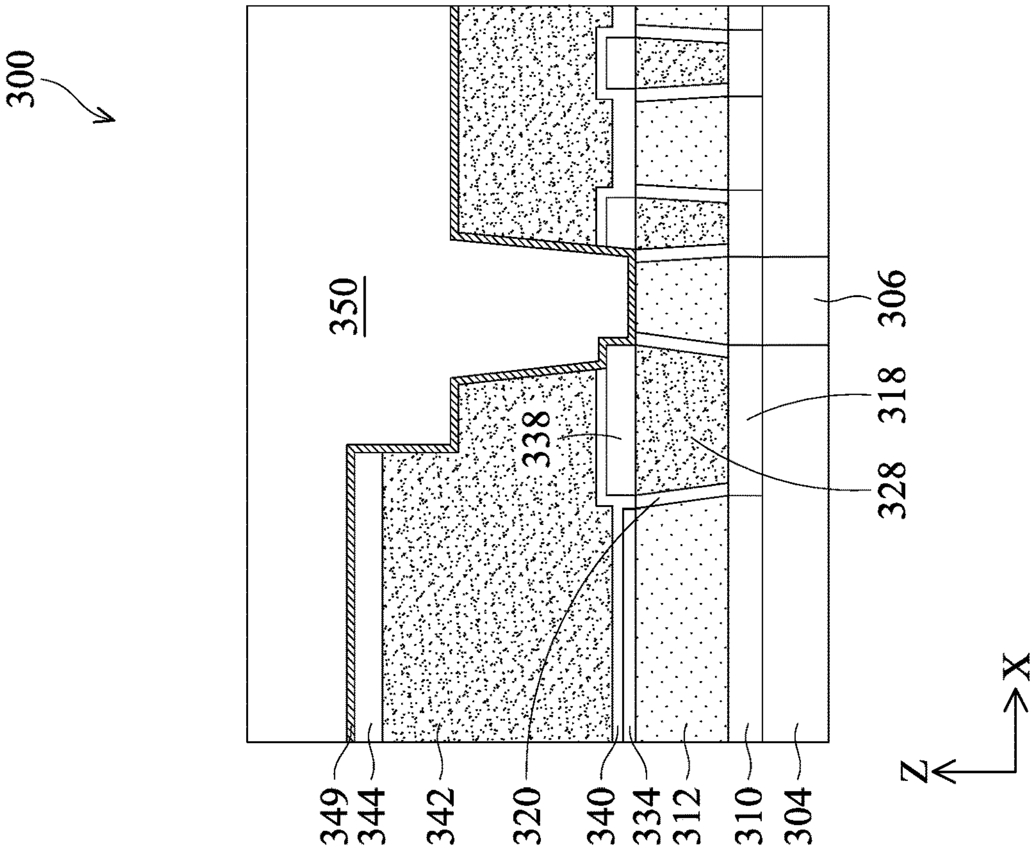

In FIG. 3K, a barrier layer 349 and a conductive feature 350 are formed in the openings 346, 348. The barrier layer 349 may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer 349 may be a conformal layer formed by a conformal process, such as ALD. The conductive feature 350 may include an electrically conductive material, such as a metal. For example, the conductive feature 350 includes Cu, Ni, Co, Ru, Ir, Al, Pt, Pd, Au, Ag, Os, W, Mo, alloys thereof, or other suitable material. The conductive feature 350 may be formed by any suitable process, such as electro-chemical plating (ECP), PVD, CVD, or PECVD. The conductive feature 350 may include a first portion disposed in the opening 348 (FIG. 3J) and a second portion disposed over the first portion. In some embodiments, the first portion of the conductive feature 350 may be a conductive via, and the second portion of the conductive feature 350 may be a conductive line. The metal oxide layer 338 prevents the conductive feature 350 from forming between the neighboring portions of the conductive layer 312. The conductive feature 350 may be disposed adjacent and over the metal oxide layer 338. In other words, a portion of the conductive feature 350 may be disposed adjacent a vertical surface of the metal oxide layer 338 and disposed over a horizontal surface of the metal oxide layer 338.

In FIG. 3L, a planarization process is performed to remove the portion of the barrier layer 349 and the conductive feature 350 disposed over the hard mask 344, and the hard mask 344 may be removed by the planarization process. The planarization process may be any suitable process, such as a CMP process. A cap layer 352 may be selectively formed on the conductive feature 350. The cap layer 352 may include the same material as the conductive feature 306. For example, the cap layer 352 includes a metal. The cap layer 352 may be formed by the same process as the cap layer 308. The cap layer 352 may be selectively formed on the conductive feature 350, which may be metallic, but not on the dielectric material 342. While not shown, it is contemplated that one or more back-end-of-line (BEOL) processes may be performed on the dielectric material 342 and the cap layer 352.

Figure 4A:
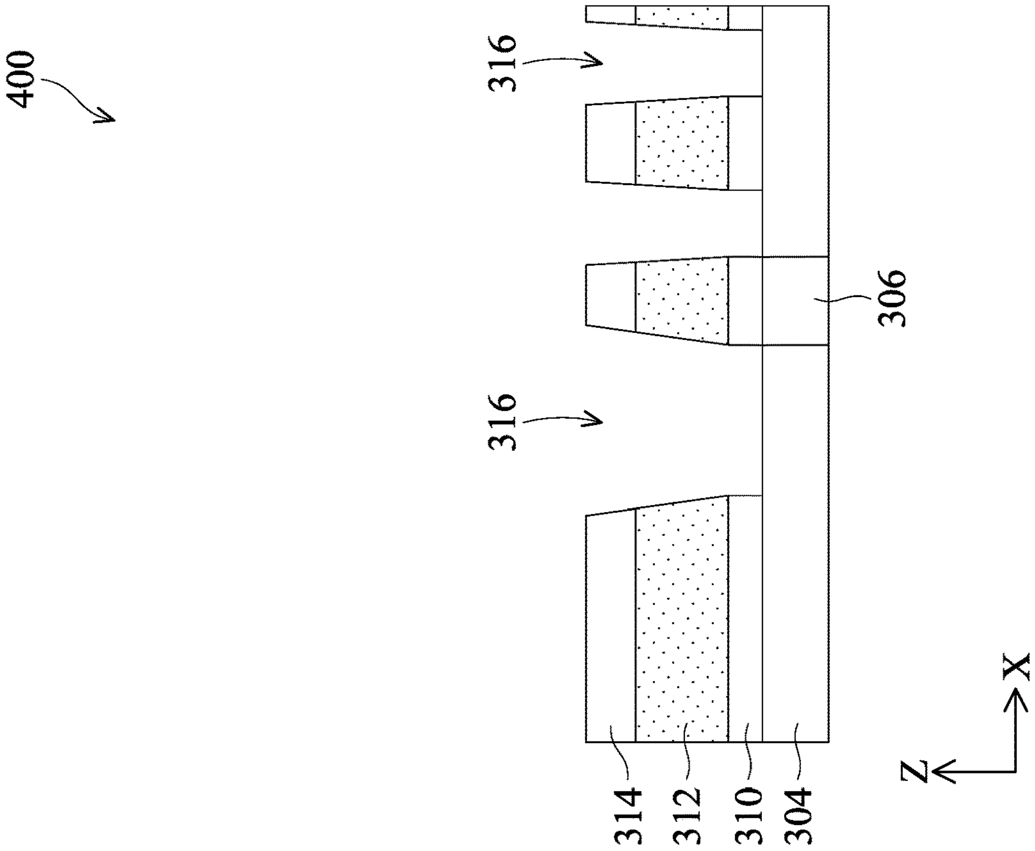
FIGS. 4A-4F are cross-sectional side views of various stages of manufacturing an interconnect structure, in accordance with some embodiments.
Figure 4B:
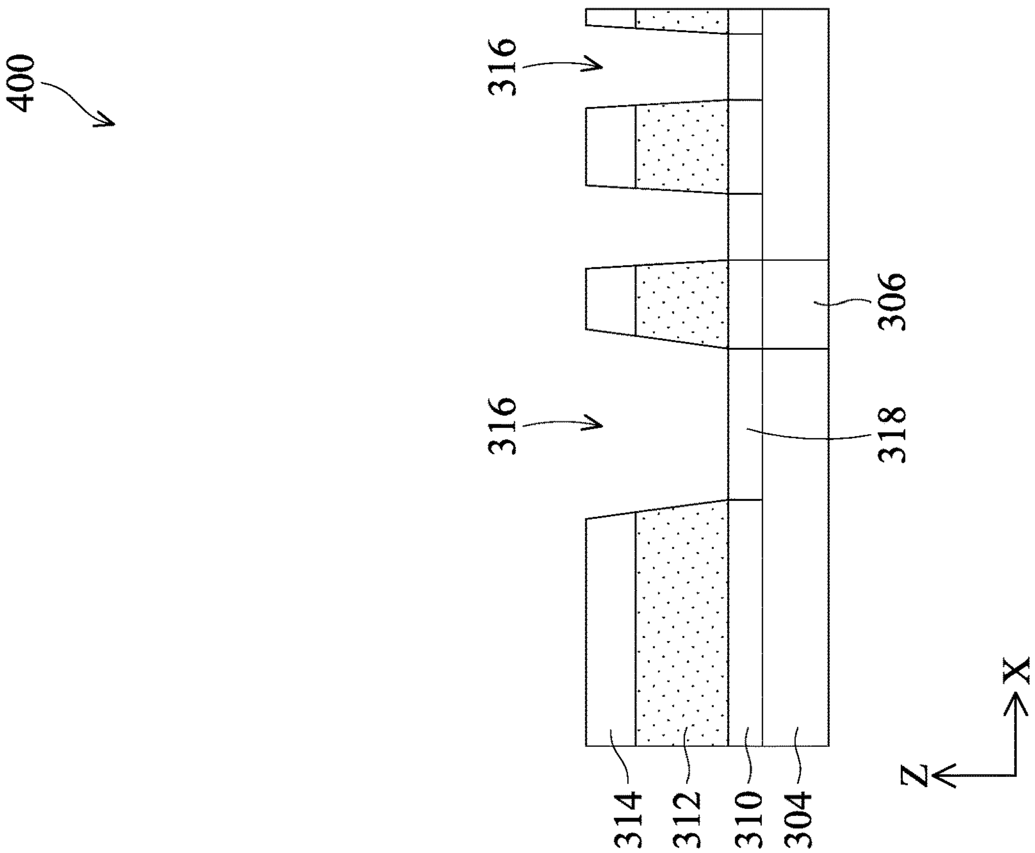
Figure 4D:
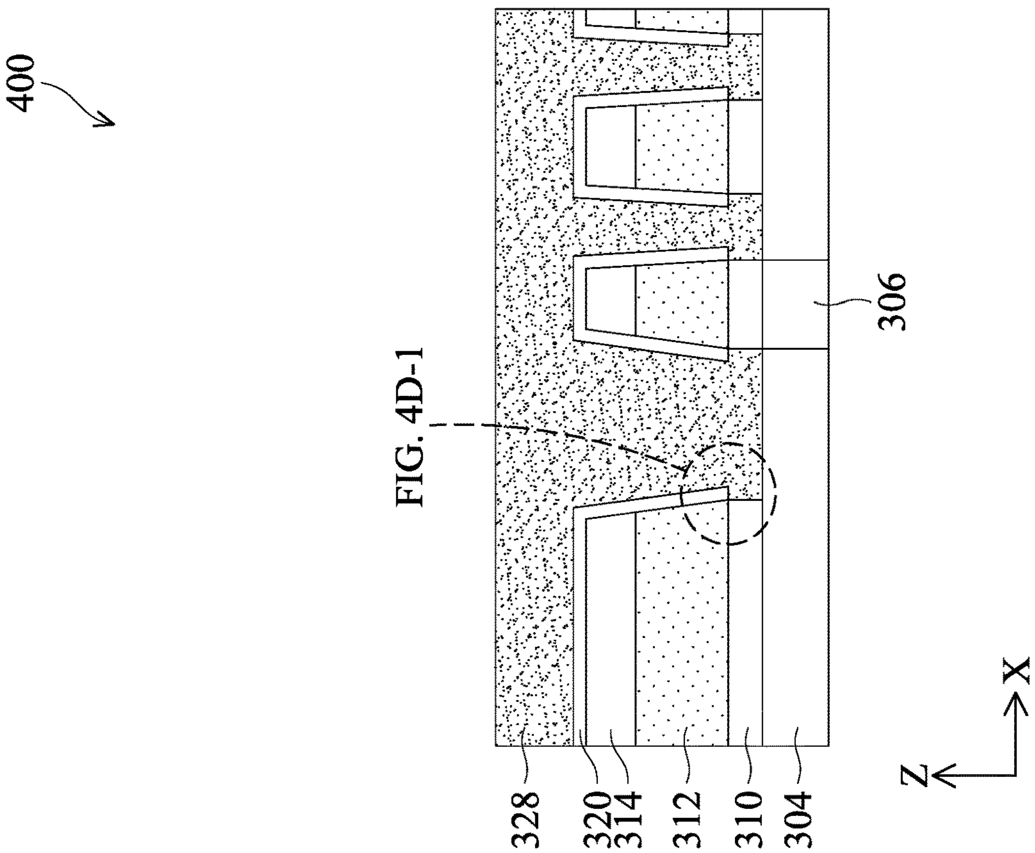
Figure 4C:
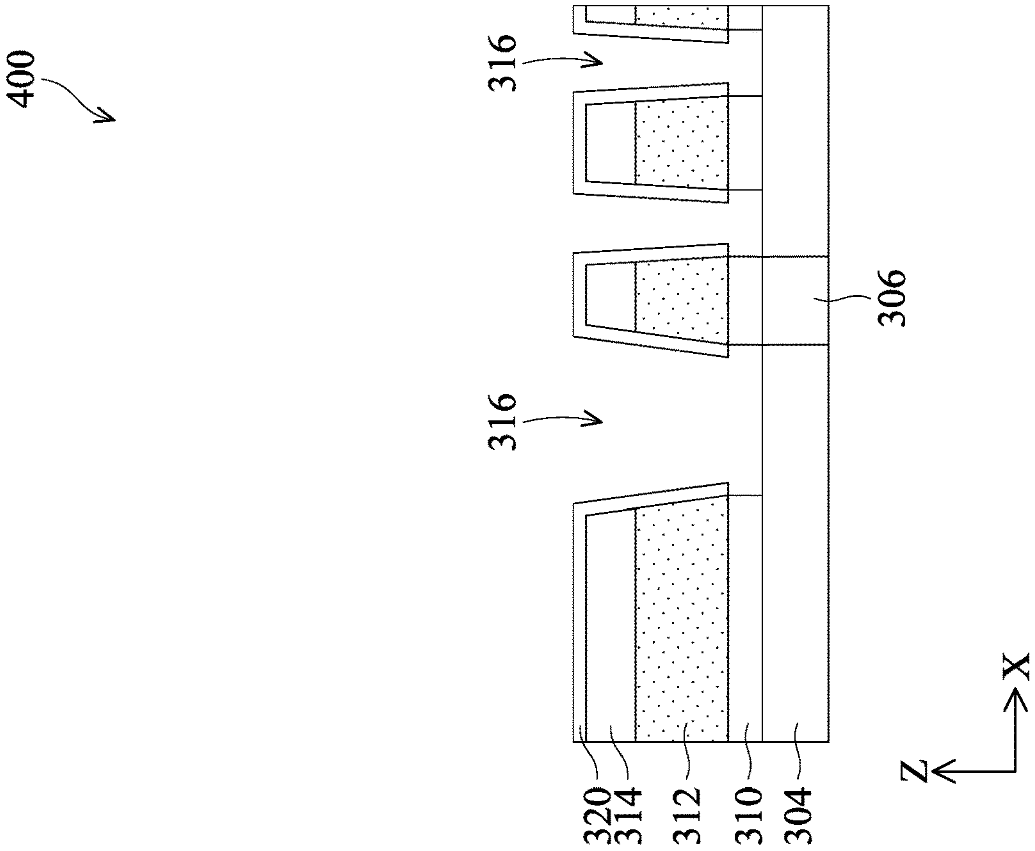
Figures 1, 4D:
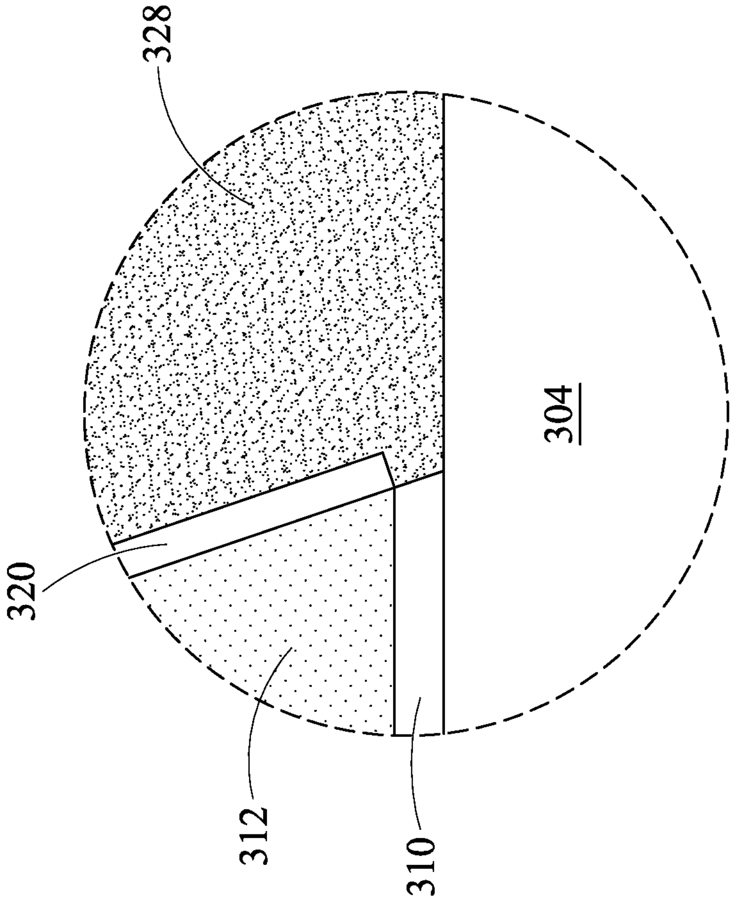
Figure 4F:
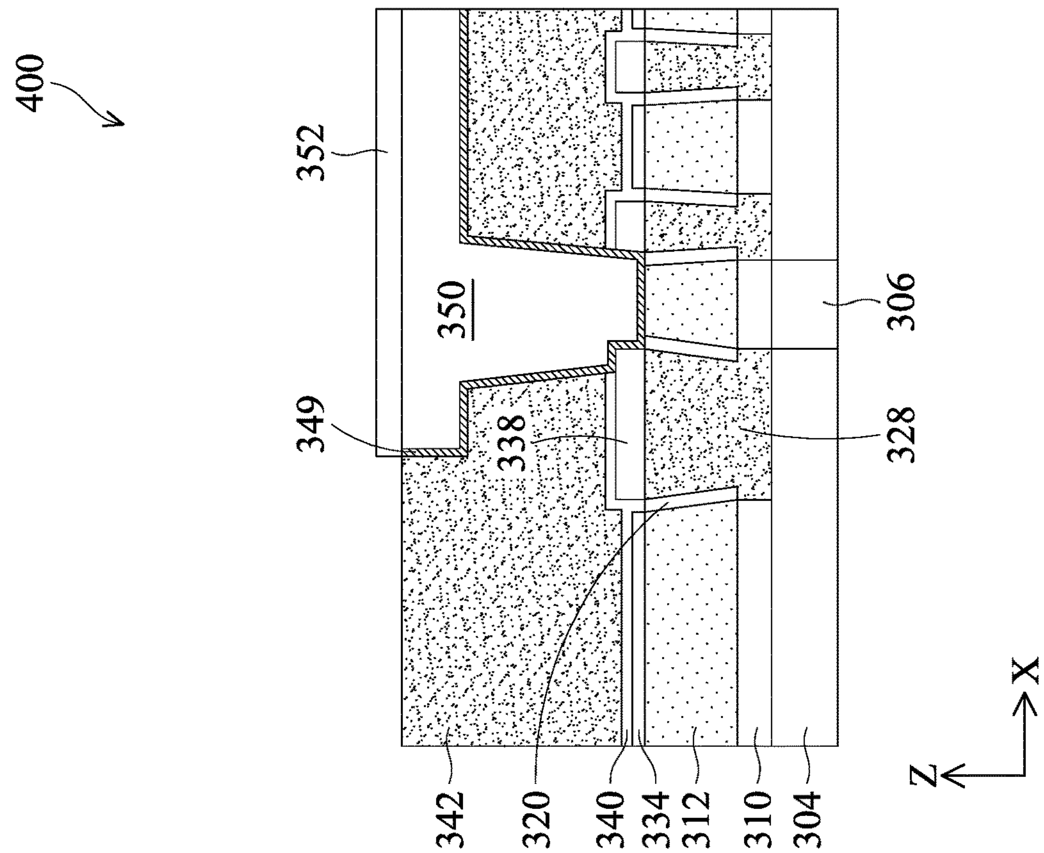

FIGS. 4A-4F are cross-sectional side views of various stages of manufacturing an interconnect structure 400, in accordance with some embodiments. Various embodiments of the interconnect structure 400 may be used to form one or more layers of the interconnect structure 250 shown in FIGS. 1A, 1B and 2. The embodiment shown in FIGS. 4A-4F is substantial identical to the embodiment shown in FIGS. 3A-3L except that the first blocking layer 318 is removed prior to forming the dielectric material 328. In this embodiment, after the first blocking layer 318 is deposited (FIG. 4B), the barrier layer 320 is selectively deposited on the exposed surfaces of the glue layer 312 (if revealed), the conductive layer 312, the hard mask 314, as shown in FIG. 4C. The barrier layer 320 may be deposited in a similar fashion to those discussed above with respect to FIG. 3C. Next, the first blocking layer 318 is removed (FIG. 4D). The first blocking layer 318 may be removed using any suitable process, such as plasma treatment, thermal treatment (e.g., UV curing), or selective plasma etching. In cases where a plasma treatment is used, the first blocking layer 318 and the barrier layer 320 may be both exposed to a plasma containing $H_2$, $H_2/NH_3$, $NH_3$, etc. The plasma may be generated in-situ or from a remote plasma source. The plasma treatment removes the first blocking layer 318 while densifying the barrier layer 320.

Figure 4E:
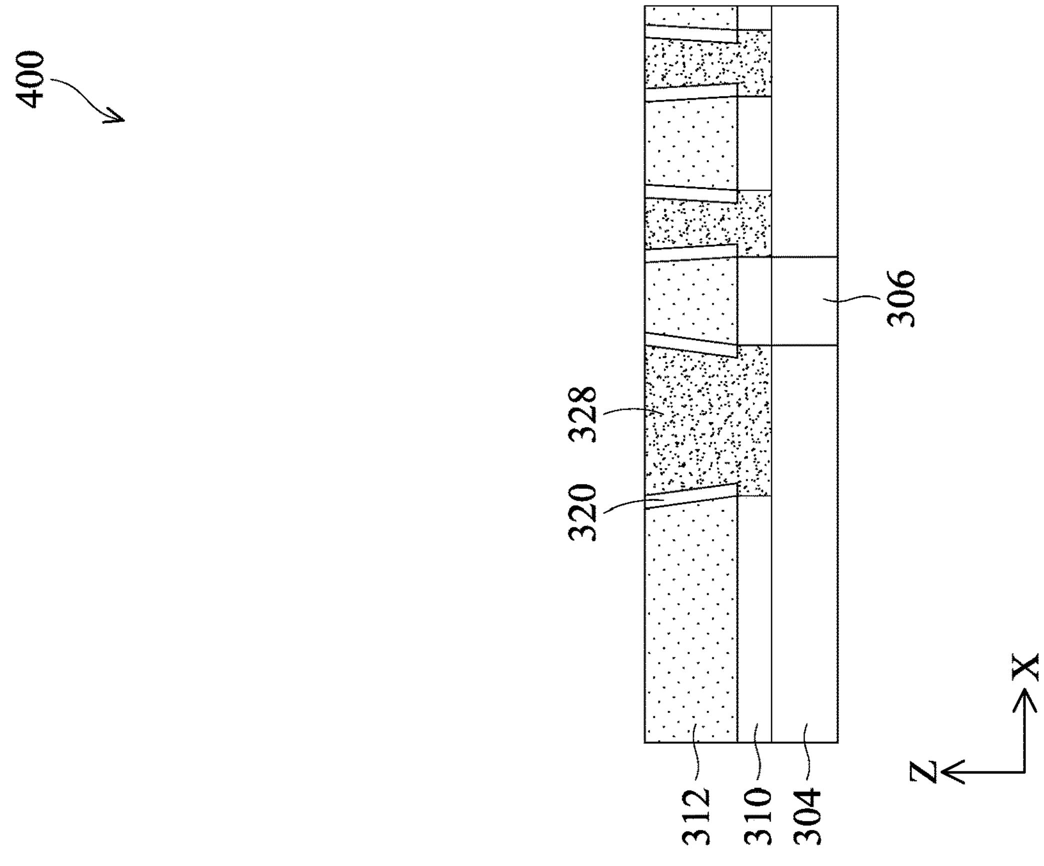

Once the first block layer 318 is removed, portions of the glue layer 312 and the dielectric layer 304 are exposed, and the dielectric material 328 is deposited on the barrier layer 320, the glue layer 312, and the dielectric layer 304 in a similar fashion as discussed above with respect to FIG. 3D. Since the first blocking layer 318 is not present, the dielectric material 328 is in direct contact with the dielectric layer 304 and the glue layer 310, as shown in FIG. 4D. Similarly, a planarization process is performed to remove the portion of the dielectric material 328, the barrier layer 320, and the hard mask 314 until the conductive layer 312 is exposed, as shown in FIG. 4E. After the planarization process, the top surfaces of the conductive layer 312, the barrier layer 320, and the dielectric material 328 are substantially co-planar. Thereafter, the process discussed above with respect to FIGS. 3F-3L may be performed to arrive at the interconnect structure 400 shown in FIG. 4F. The barrier layer 320 is disposed between and in contact with the conductive layer 312 and the dielectric material 328. The top surface of the barrier layer 320 is in contact with the etch stop layer 340, and the top surface of the dielectric material 328 is in contact with the metal oxide layer 338.

In this embodiment, the interconnect structure 400 is formed with low contact resistance and low capacitive coupling between neighboring conductive features because the dielectric material 328 is in direct contact with the dielectric layer 304 without the presence of the dielectric barrier layer disposed therebetween, which may otherwise induce TDDB failure due to poor barrier properties using a dielectric. In addition, since the portions of metal like barrier layer 320 formed on adjacent portions of the conductive layer 312 are not connected, TDDB failure due to line to line leakage, i.e., leakage between adjacent portions of the conductive layer 312, is reduced.

FIG. 4D-1 is an enlarged view of a portion of the interconnect structure 400 shown in FIG. 4D in accordance with some embodiments. As can be seen, a bottom portion of the dielectric material 328 has a footing extended radially into a region created as a result of removal of the first blocking layer 318, which is defined by the barrier layer 320, the glue layer 310, and the dielectric layer 304. Therefore, a portion of the dielectric material 328 extends laterally and outwardly to contact at least a bottom surface of the barrier layer 320. The dielectric material 328 thus shows an inverted T-shaped profile at a bottom, which is in contact with the dielectric layer 304, the glue layer 310, and the barrier layer 320. Particularly, the glue layer 310 is free from being contacted with the barrier layer 320.

Figure 5B:
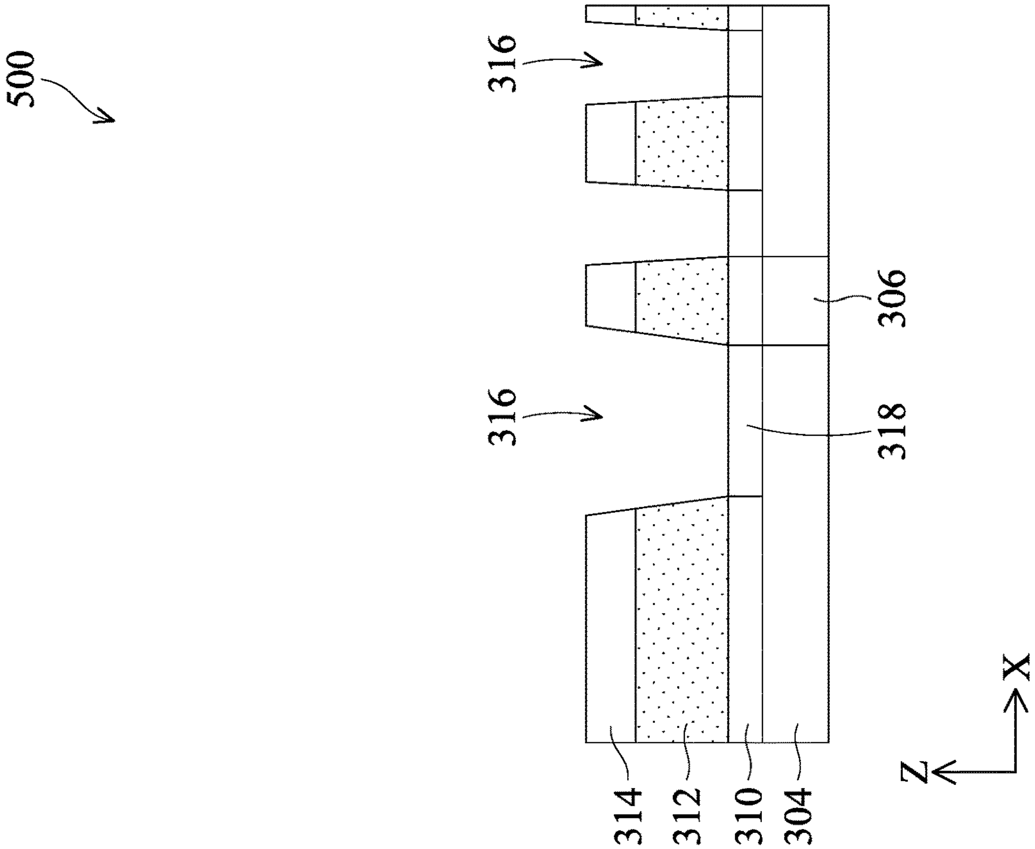
FIGS. 5A-5G are cross-sectional side views of various stages of manufacturing an interconnect structure, in accordance with some embodiments.
Figure 5A:
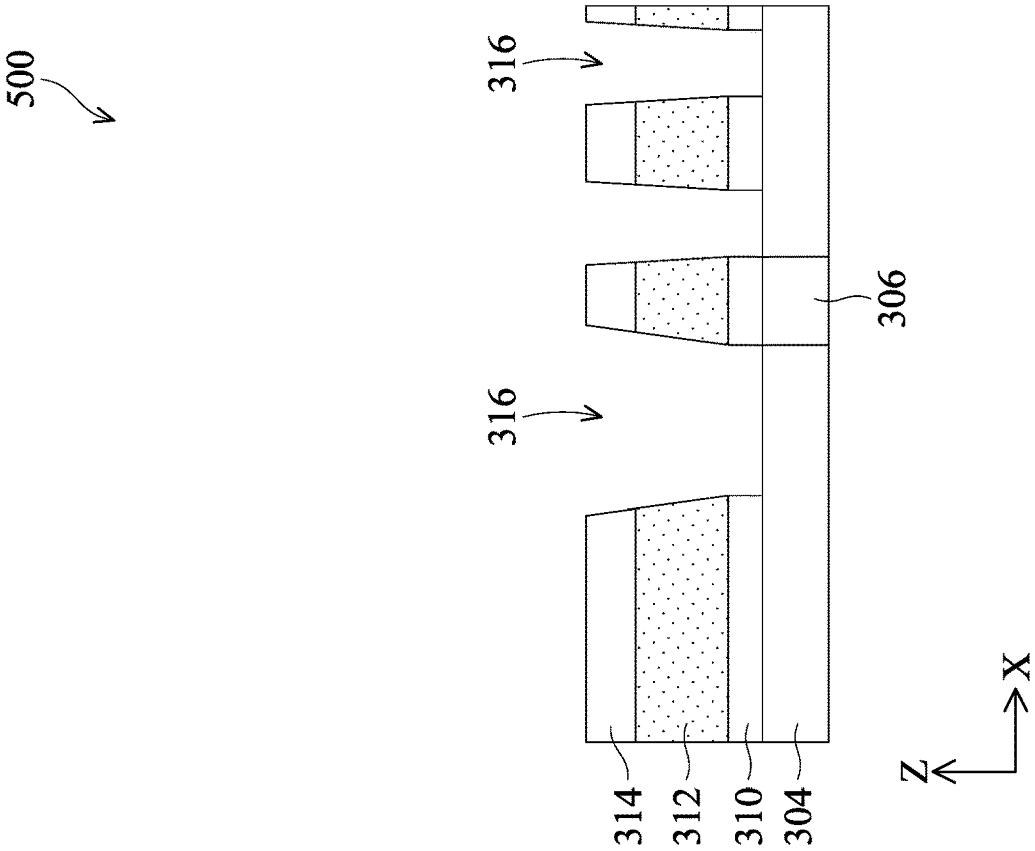
Figure 5C:
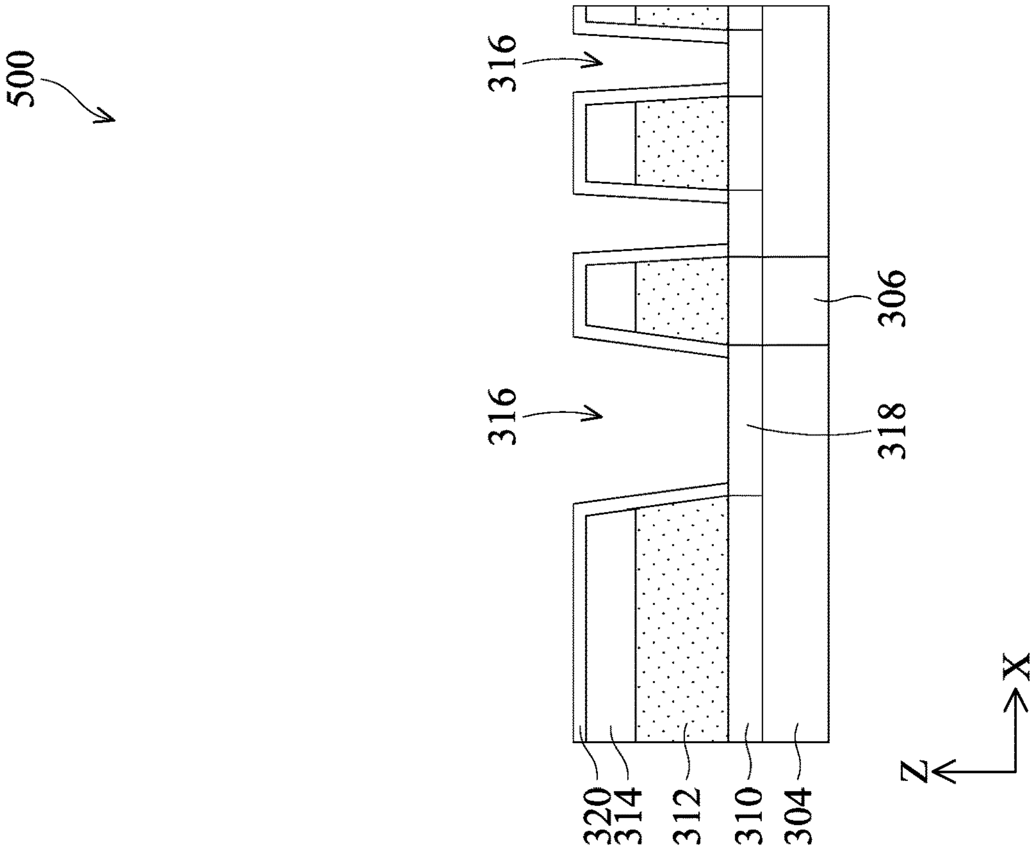
Figure 5D:
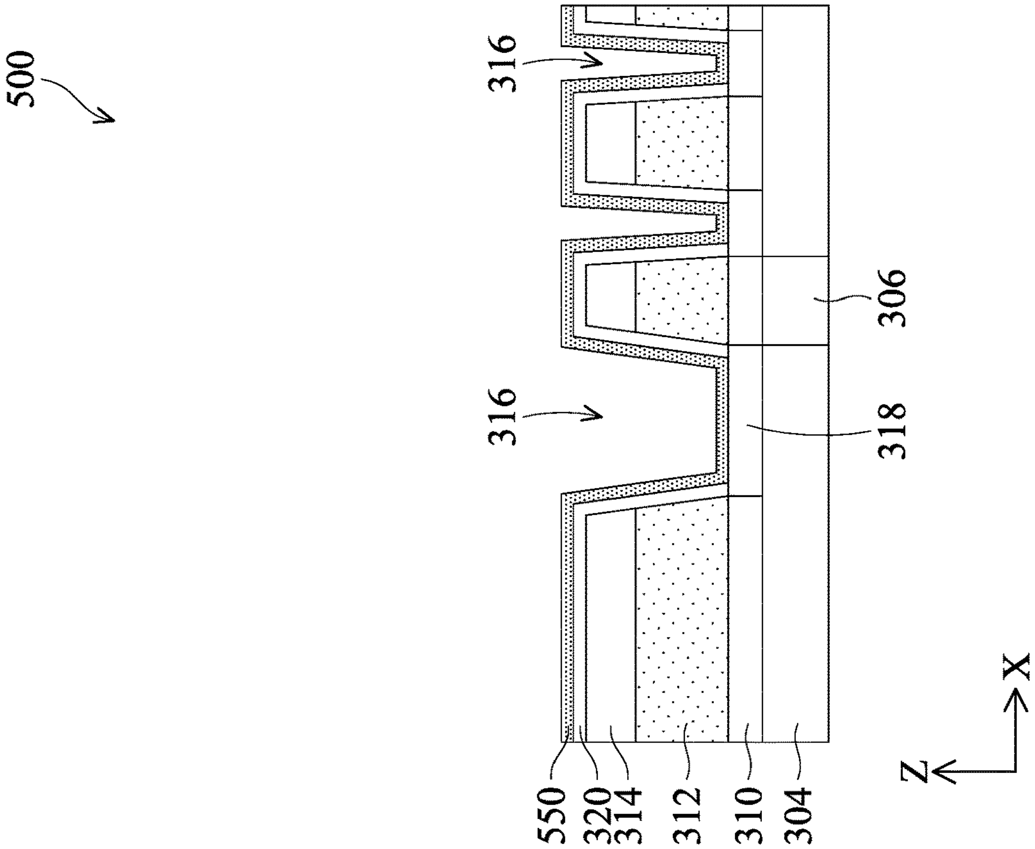
Figure 5F:
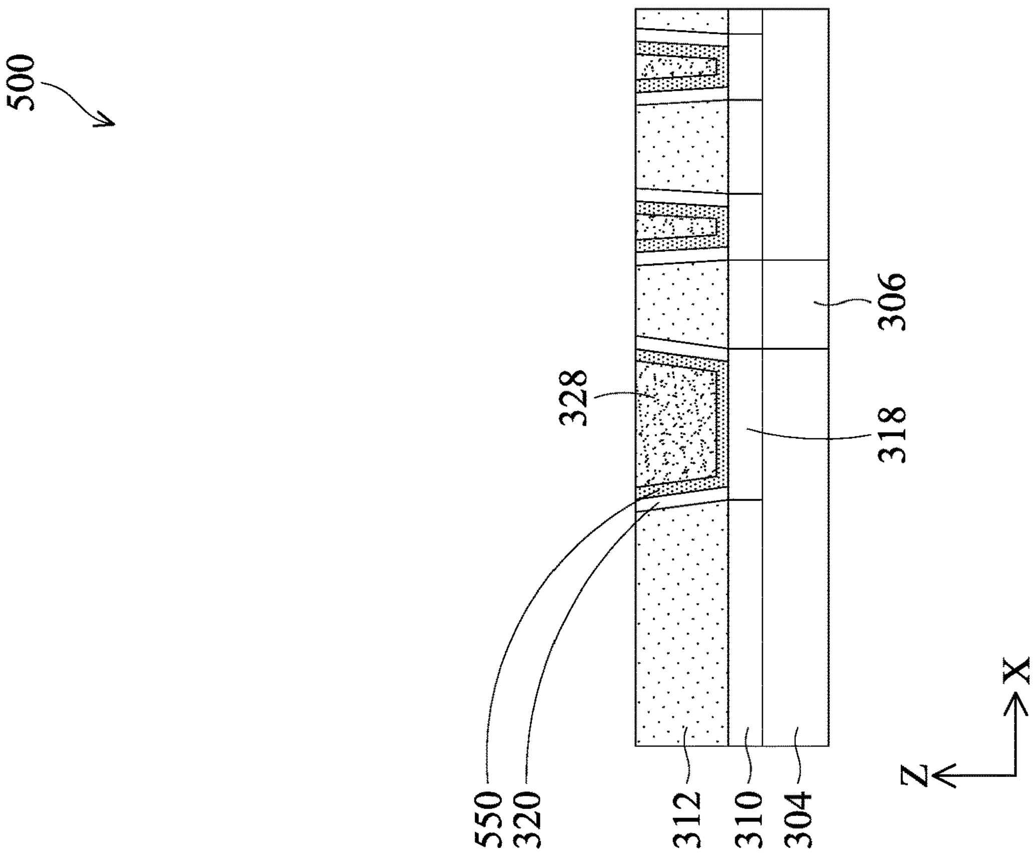
Figure 5E:
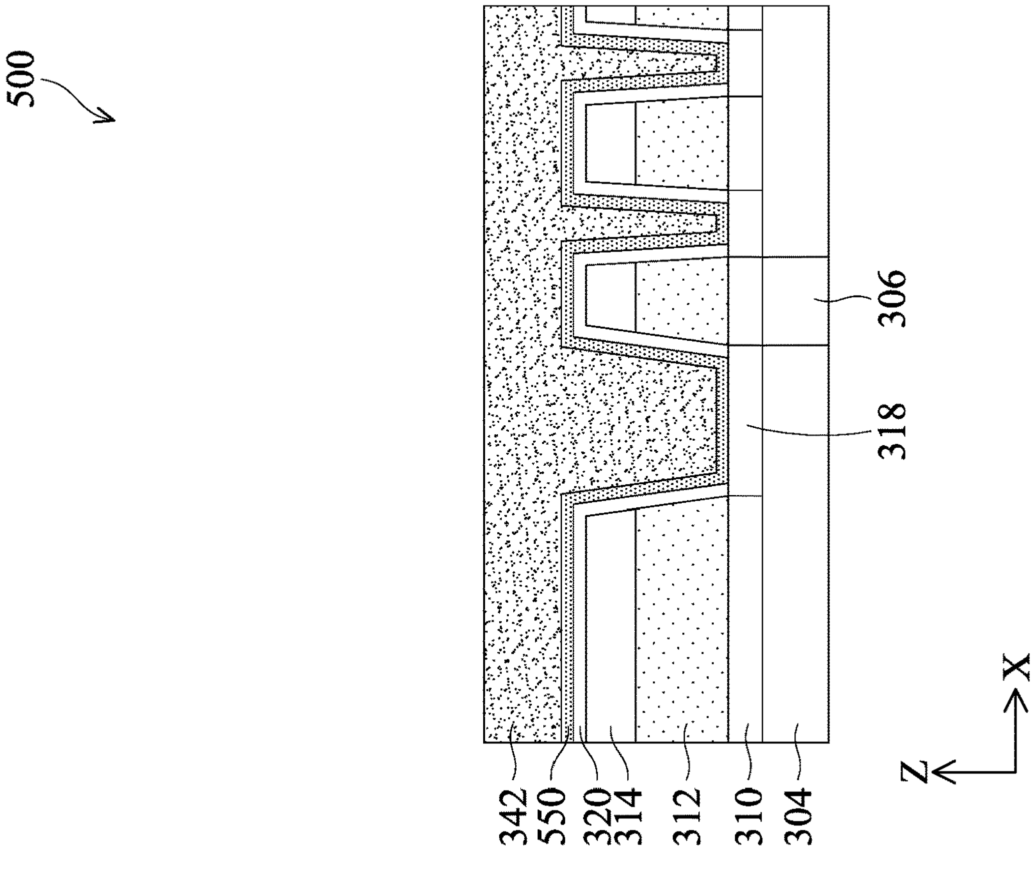
Figure 5G:
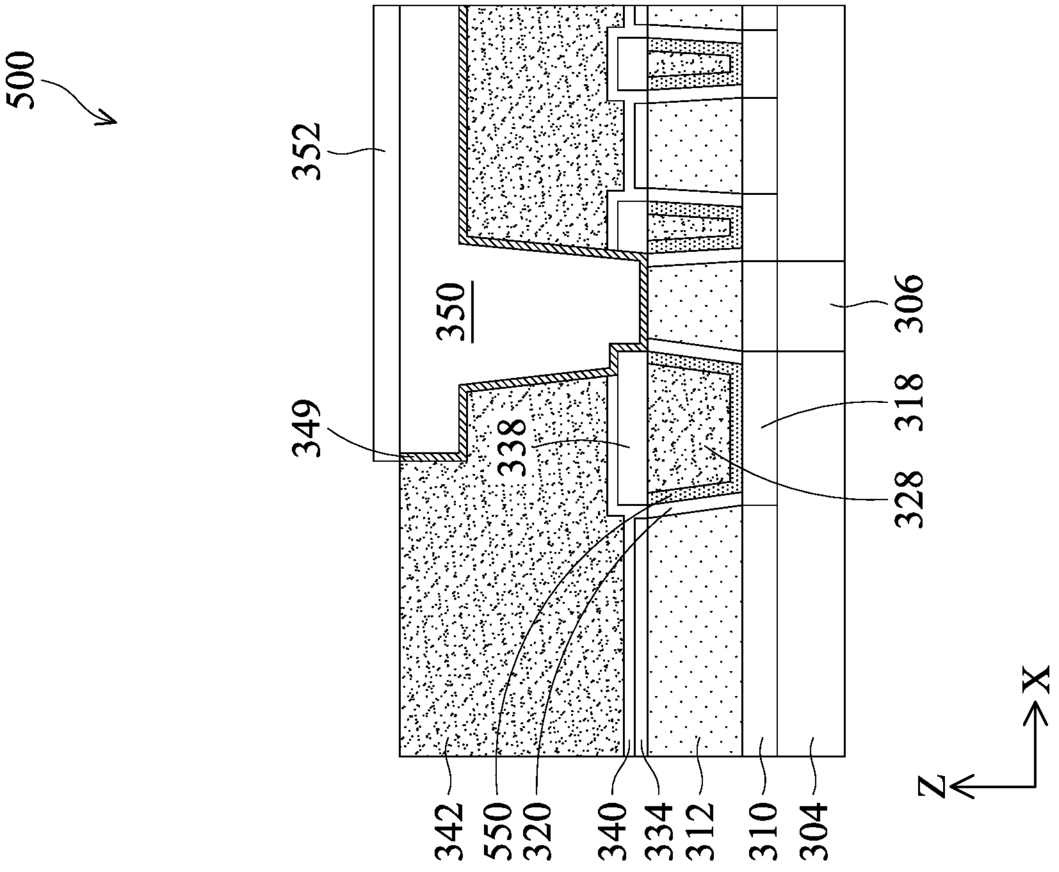

FIGS. 5A-5G are cross-sectional side views of various stages of manufacturing an interconnect structure 500, in accordance with some embodiments. Various embodiments of the interconnect structure 500 may be used to form one or more layers of the interconnect structure 250 shown in FIGS. 1A, 1B and 2. The embodiment shown in FIGS. 5A-5G is substantial identical to the embodiment shown in FIGS. 3A-3L except that a capping layer is further disposed on the barrier layer 320 and the first blocking layer 318 prior to forming the dielectric material 328. In this embodiment, after the first blocking layer 318 is deposited (FIG. 5B), the barrier layer 320 is selectively deposited on the exposed surfaces of the glue layer 312 (if revealed), the conductive layer 312, the hard mask 314, as shown in FIG. 5C. The barrier layer 320 may be deposited in a similar fashion to those discussed above with respect to FIG. 3C. A capping layer 550 is then conformally deposited on the barrier layer 320 and the first blocking layer 318, as shown in FIG. 5D. The capping layer 550 protects the barrier layer 320 from being oxidized during the subsequent deposition of the dielectric material 328. The presence of the capping layer 550 is advantageous when the dielectric material 328 includes an oxide, which may oxidize the barrier layer 320 during formation of the dielectric material 328. The capping layer 550 may be a silicon-containing material, such as SiOC, SiCN, SiN, SiCON, SiC, or SiON. In some embodiments, the capping layer 550 and the subsequent dielectric material 328 include a material chemically different from each other. The capping layer 550 may be formed by ALD, CVD, PVD, PEALD, or other suitable process. The capping layer 550 may have a thickness ranging from about 5 Angstrom to about 50 Angstroms. After the capping layer 550 is formed, the dielectric material 328 is deposited on the capping layer 550 (FIG. 5E) in a similar fashion as discussed above with respect to FIG. 3D. A planarization process is then performed to remove portions of the dielectric material 328, the capping layer 550, the barrier layer 320, and the hard mask 314 until the conductive layer 312 is exposed, as shown in FIG. 5F. After the planarization process, the top surfaces of the conductive layer 312, the capping layer 550, the barrier layer 320, and the dielectric material 328 are substantially co-planar. Thereafter, the process discussed above with respect to FIGS. 3F-3L may be performed to arrive at the interconnect structure 400 shown in FIG. 5G.

In this embodiment, the interconnect structure 500 is formed with low contact resistance and low capacitive coupling (between neighboring conductive features) due to the inclusion of the first blocking material 318, which has a low K value, between the capping layer 550 and the dielectric layer 304. In addition, since the portions of metal like barrier layer 320 formed on adjacent portions of the conductive layer 312 are not connected, TDDB failure due to line to line leakage, i.e., leakage between adjacent portions of the conductive layer 312, is reduced.

Figure 6A:
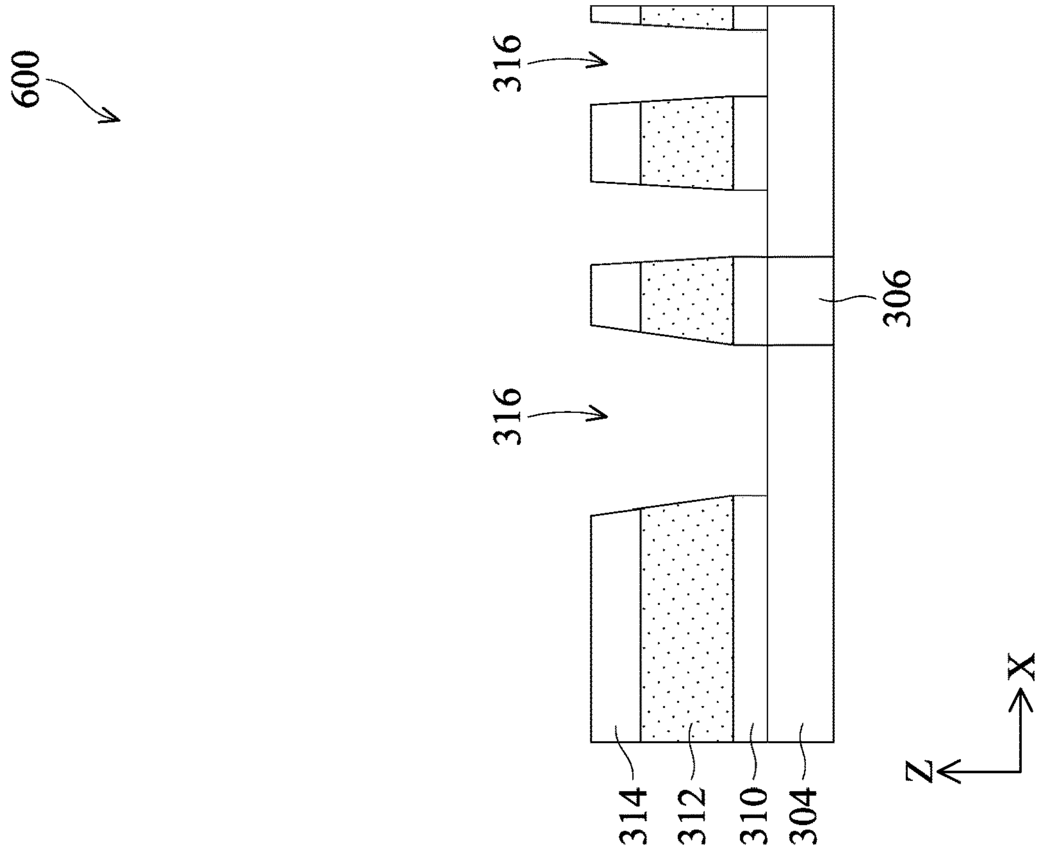
FIGS. 6A-6H are cross-sectional side views of various stages of manufacturing an interconnect structure, in accordance with some embodiments.
Figure 6B:
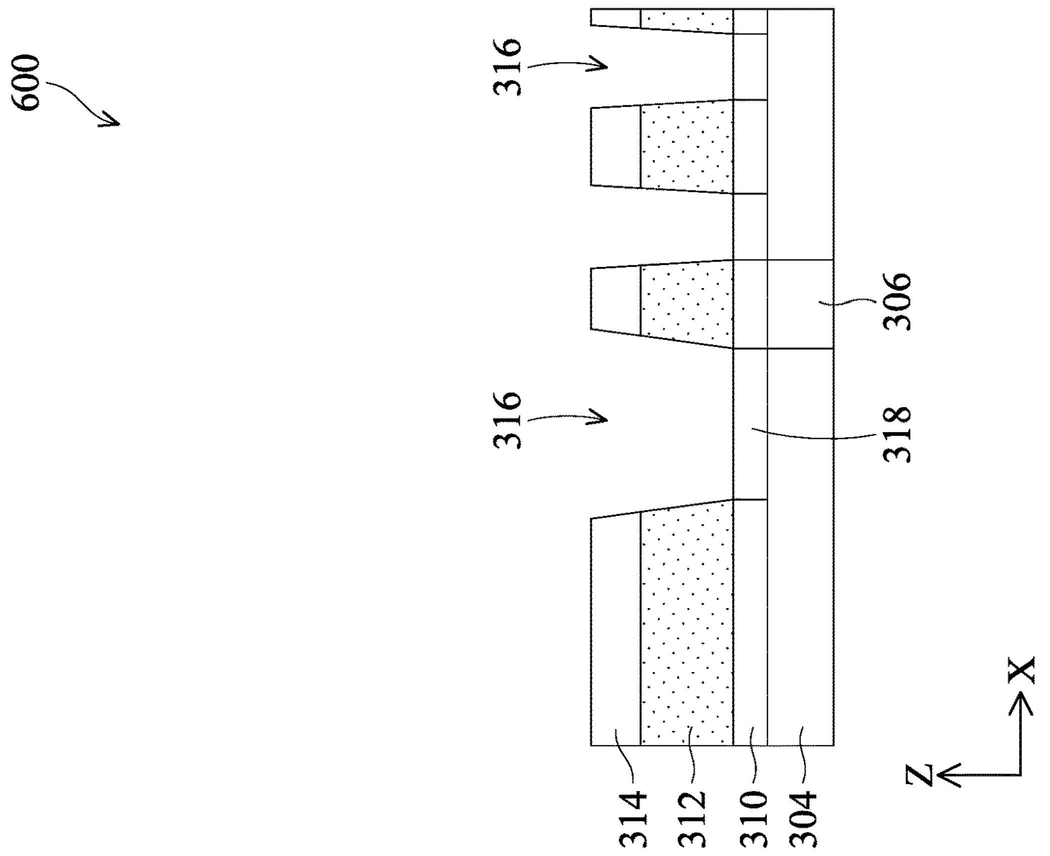
Figure 6C:
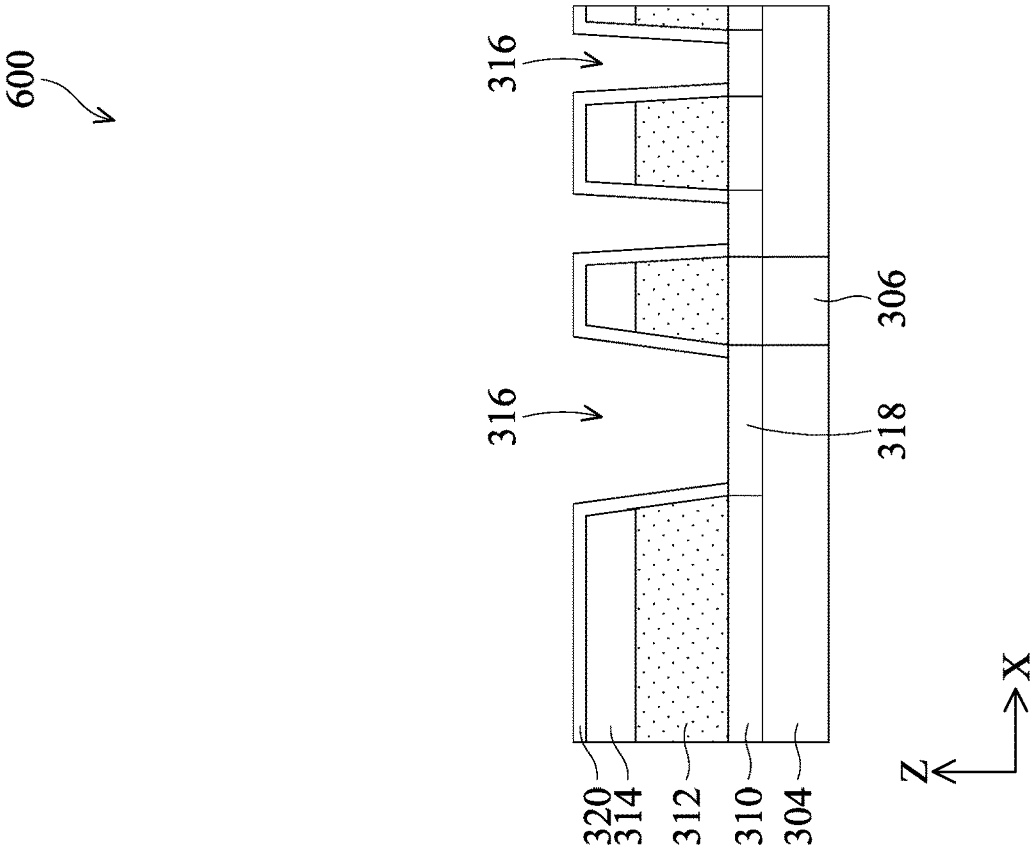
Figure 6D:
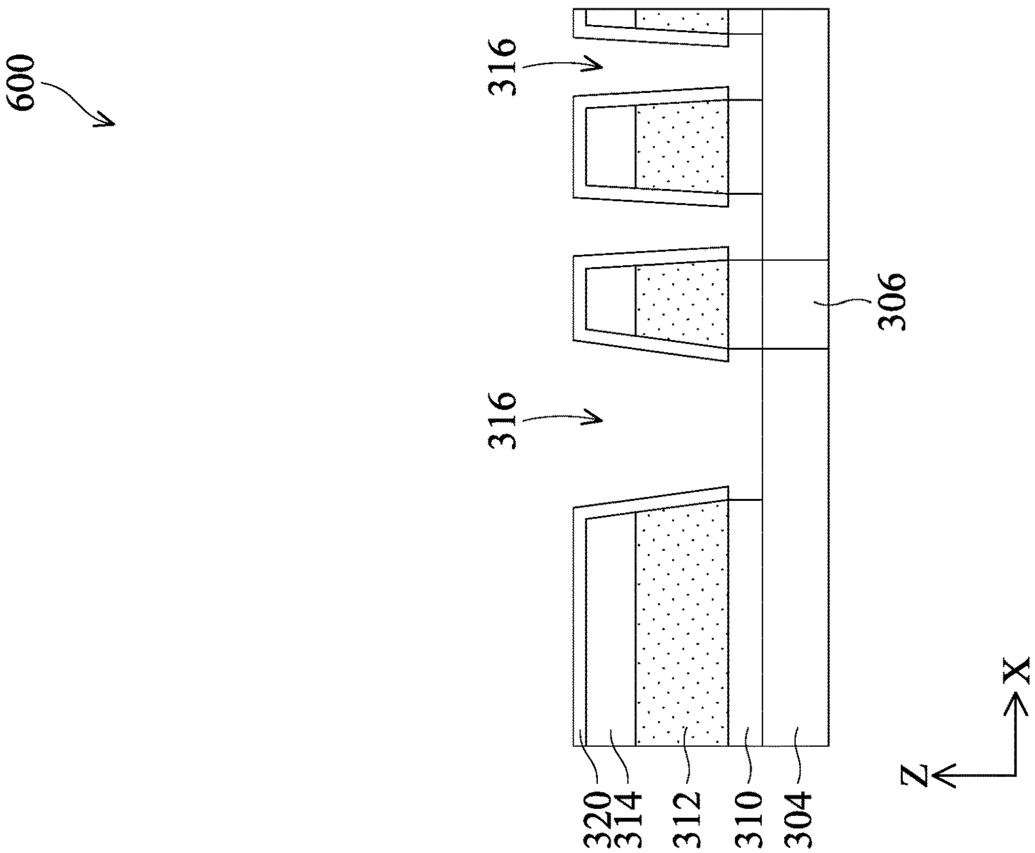
Figure 6F:
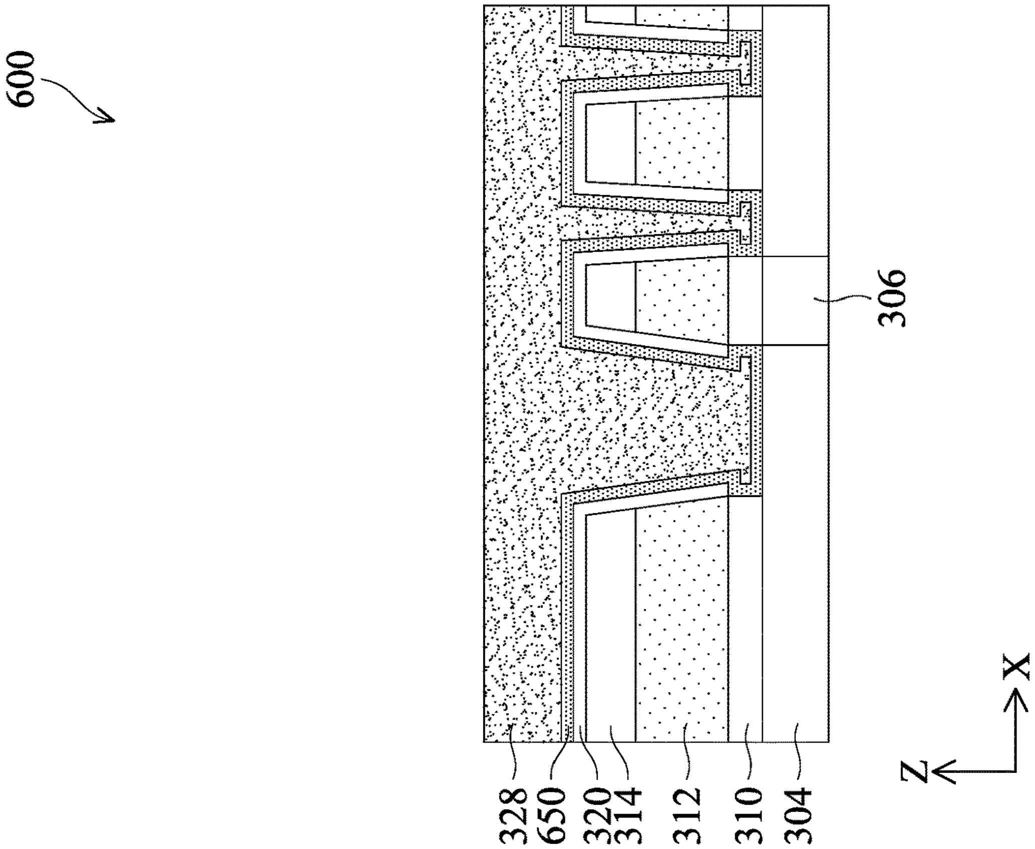
Figure 6E:
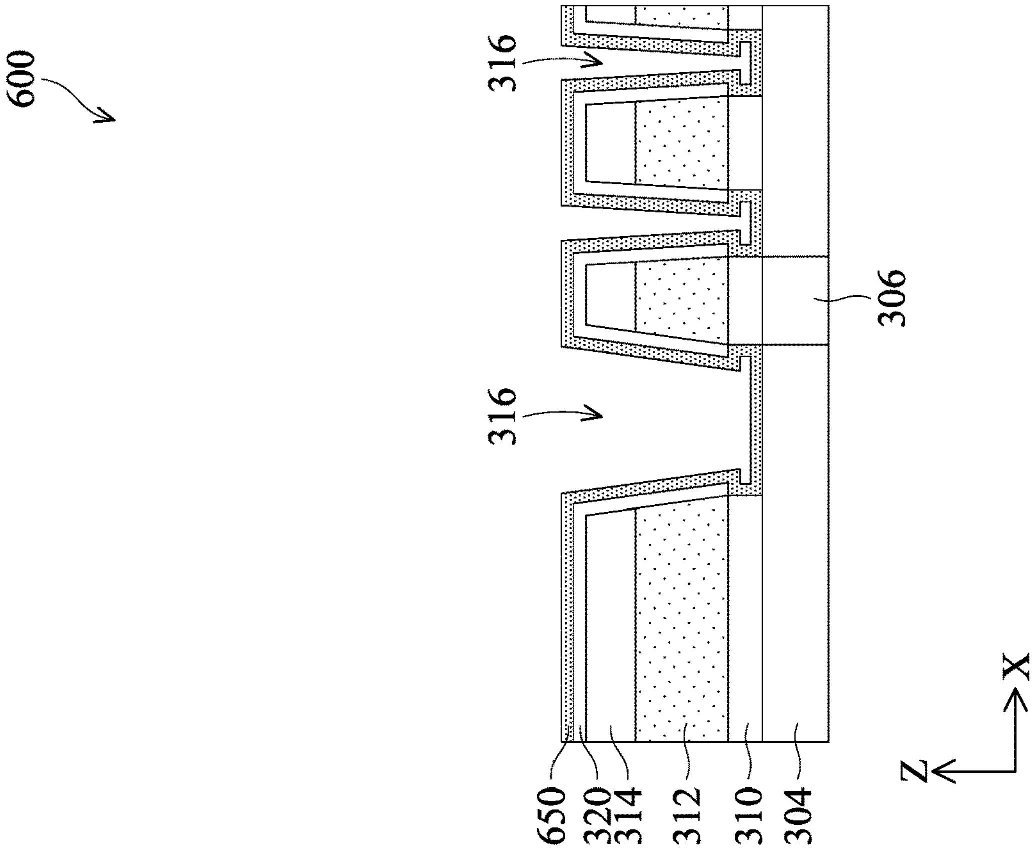
Figure 6H:
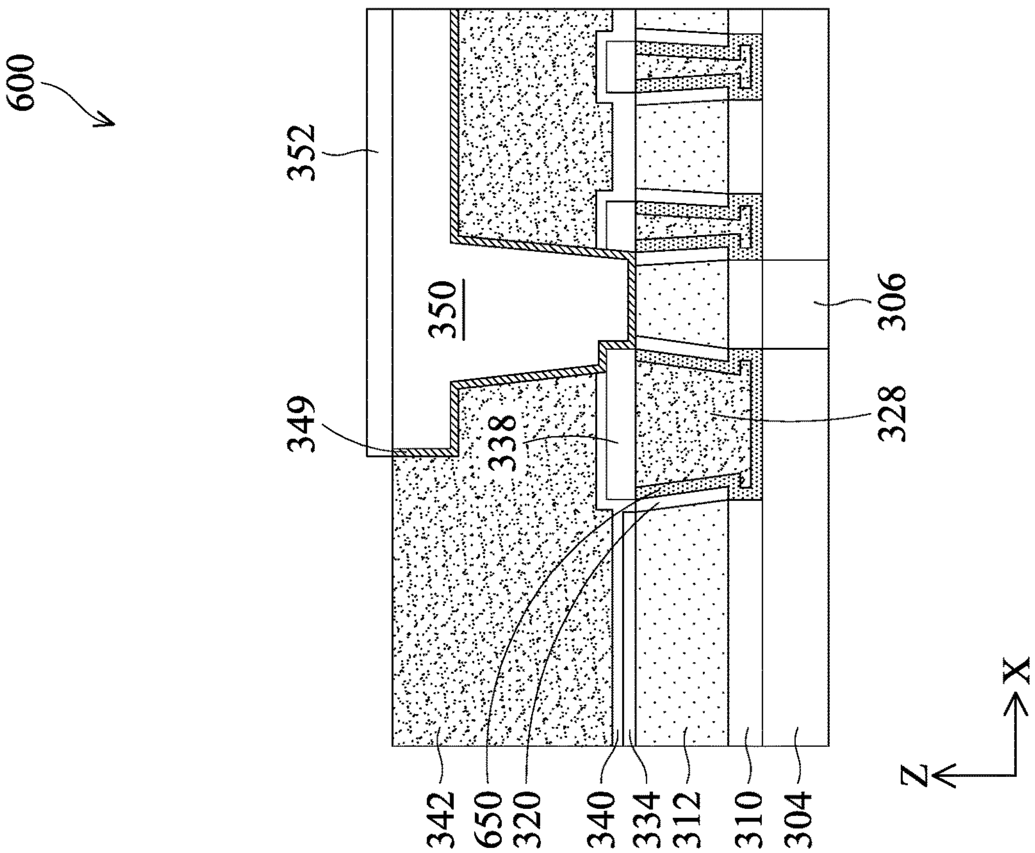
Figure 6G:
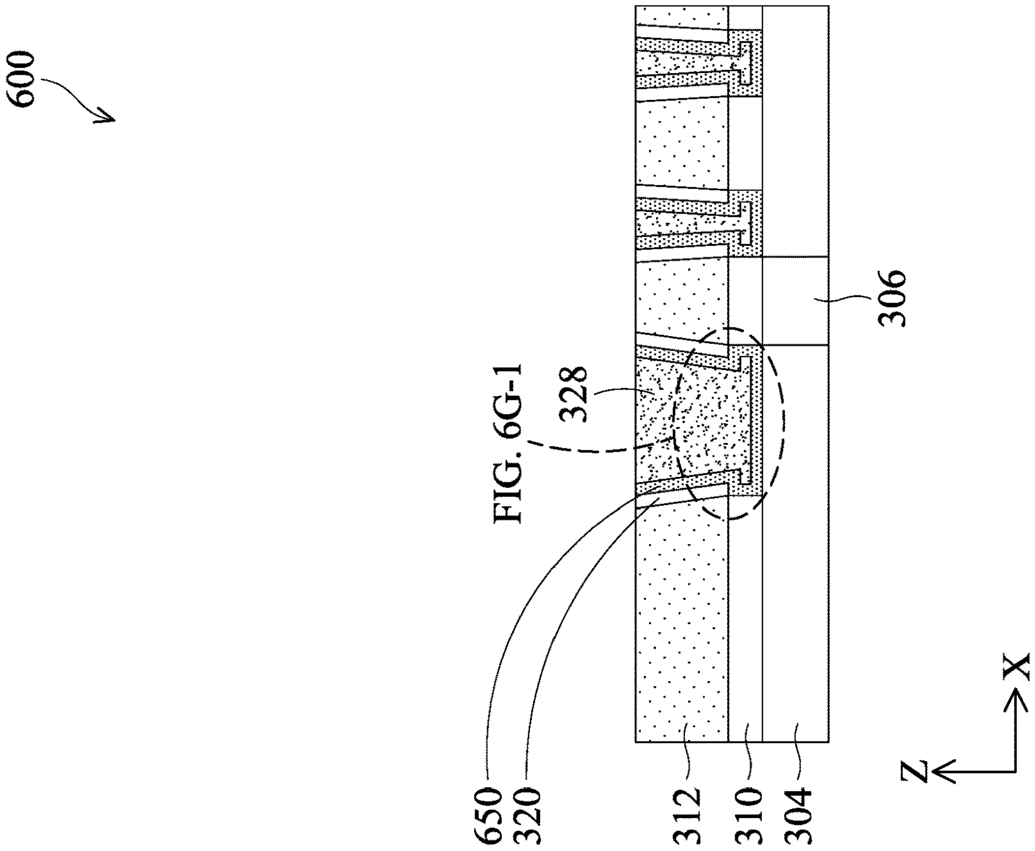
Figures 1, 6G:
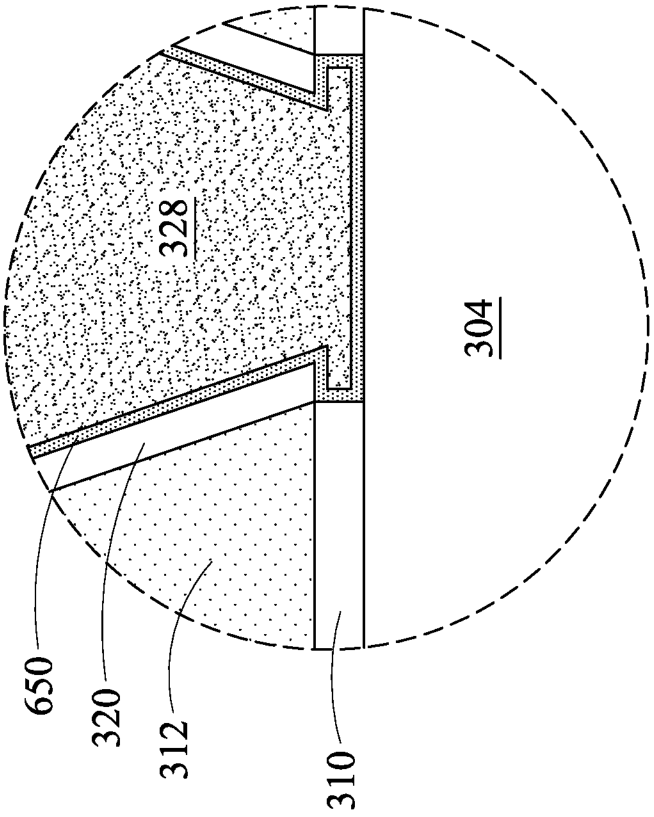

FIGS. 6A-6H are cross-sectional side views of various stages of manufacturing an interconnect structure 600, in accordance with some embodiments. Various embodiments of the interconnect structure 600 may be used to form one or more layers of the interconnect structure 250 shown in FIGS. 1A, 1B and 2. The embodiment shown in FIGS. 6A-6H is substantial identical to the embodiment shown in FIGS. 5A-5G except that the first blocking layer 318 is removed prior to forming the dielectric material 328. In this embodiment, after the first blocking layer 318 is deposited (FIG. 6B), the barrier layer 320 is selectively deposited on the exposed surfaces of the glue layer 312 (if revealed), the conductive layer 312, the hard mask 314, as shown in FIG. 6C. The barrier layer 320 may be deposited in a similar fashion to those discussed above with respect to FIG. 3C. Next, the first blocking layer 318 is removed (FIG. 6D). The first blocking layer 318 may be removed using any suitable process, such as plasma treatment, thermal treatment, or selective plasma etching. Once the first block layer 318 is removed, a capping layer 650 is then conformally deposited on the barrier layer 320, the glue layer 310, and the dielectric layer 304, as shown in FIG. 6E. The capping layer 650 may include the same material as the capping layer 550, and may be deposited using the same deposition technique as the capping layer 550. Likewise, capping layer 650 and the subsequent dielectric material 328 may include a material chemically different from each other. After the capping layer 650 is formed, the dielectric material 328 is deposited on the capping layer 650 (FIG. 6F) in a similar fashion as discussed above with respect to FIG. 3D. A planarization process is then performed to remove portions of the dielectric material 328, the capping layer 650, the barrier layer 320, and the hard mask 314 until the conductive layer 312 is exposed, as shown in FIG. 6G. After the planarization process, the top surfaces of the conductive layer 312, the capping layer 650, the barrier layer 320, and the dielectric material 328 are substantially co-planar. Thereafter, the process discussed above with respect to FIGS. 3F-3L may be performed to arrive at the interconnect structure 400 shown in FIG. 6H.

In this embodiment, the interconnect structure 600 is formed with low contact resistance and low capacitive coupling (between neighboring conductive features) since a portion of the capping layer 650 is disposed between and in contact with the dielectric material 328 and the dielectric layer 304, which provides good barrier properties without leakage concern that may otherwise occur due to TDDB failure from the use of dielectric barrier. In addition, since the portions of metal like barrier layer 320 formed on adjacent portions of the conductive layer 312 are not connected, TDDB failure due to line to line leakage, i.e., leakage between adjacent portions of the conductive layer 312, is reduced.

FIG. 6G-1 is an enlarged view of a portion of the interconnect structure 600 shown in FIG. 6G in accordance with some embodiments. As can be seen, a bottom portion of the dielectric material 328 has a footing extended radially into a region defined by the barrier layer 320, the glue layer 310, and the dielectric layer 304. The dielectric material 328 thus shows an inverted T-shaped profile at a bottom. The dielectric material 328 is separated from the barrier layer 320, the glue layer 310, and the dielectric layer 304 by the capping layer 650, which is in direct contact with the dielectric layer 304, the glue layer 310, and the barrier layer 320. Particularly, the glue layer 310 is free from being contacted with the barrier layer 320.

Figure 7A:
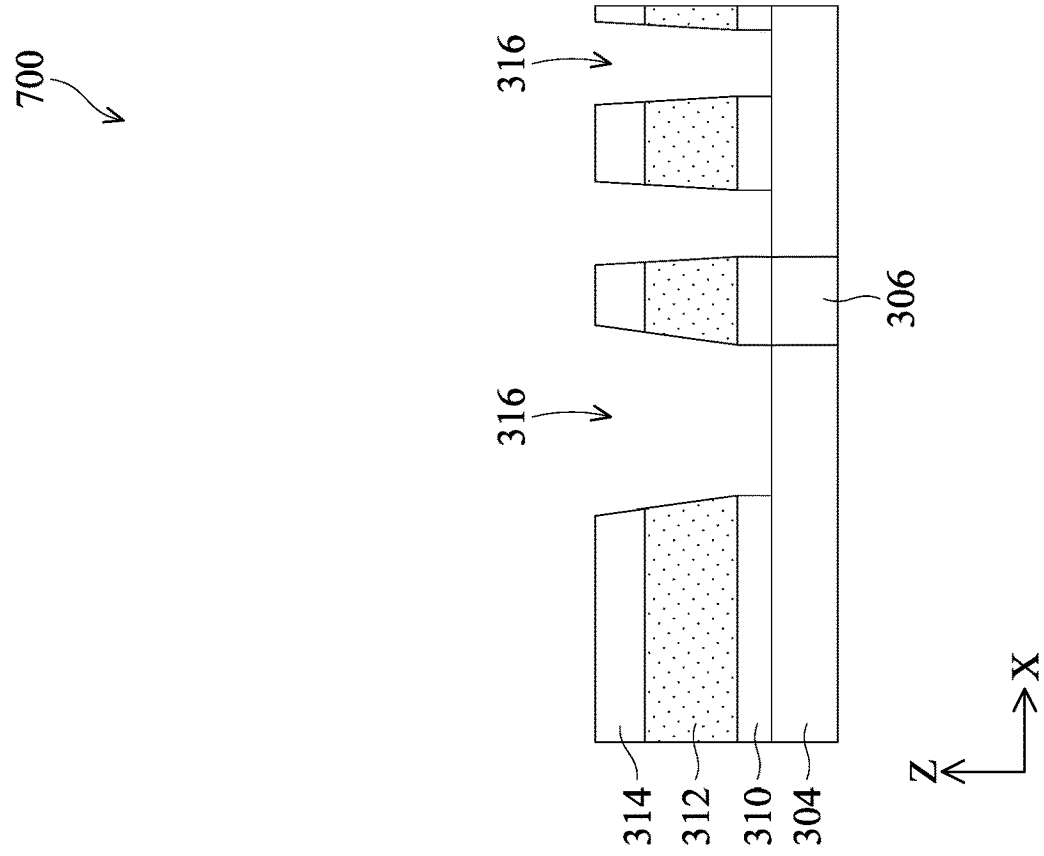
FIGS. 7A-7P are cross-sectional side views of various stages of manufacturing an interconnect structure, in accordance with some embodiments.
Figure 7B:
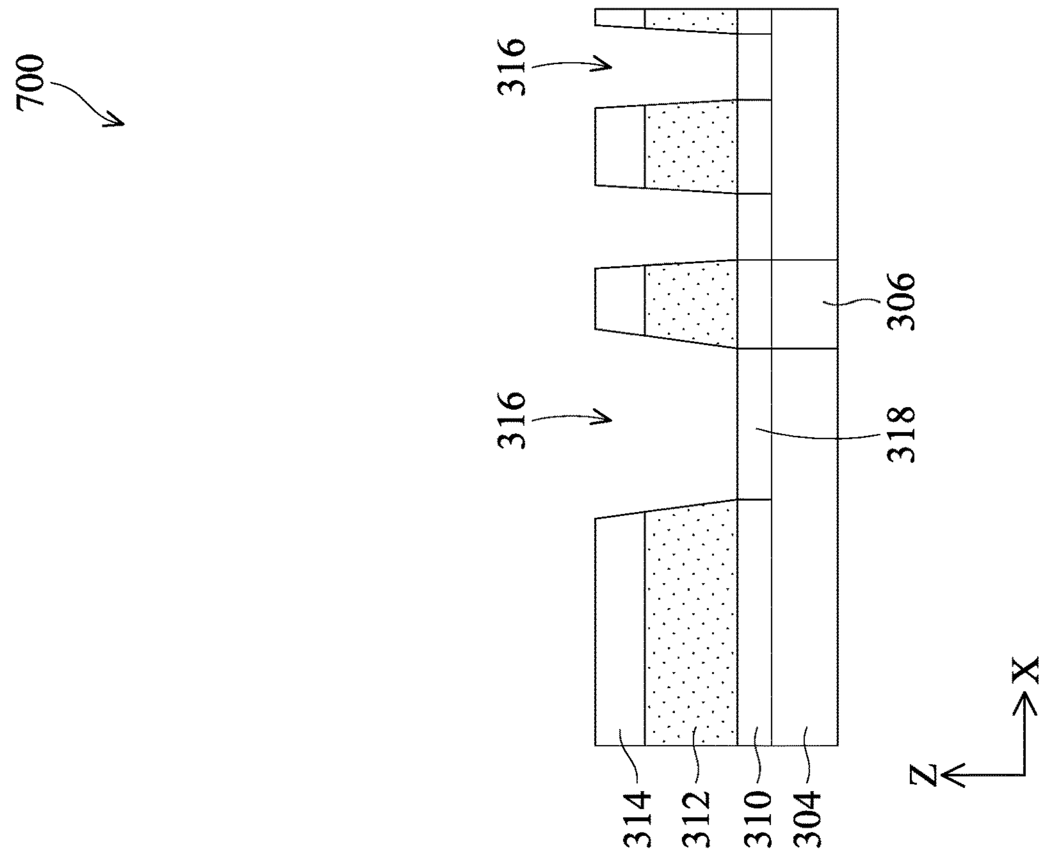
Figure 7D:
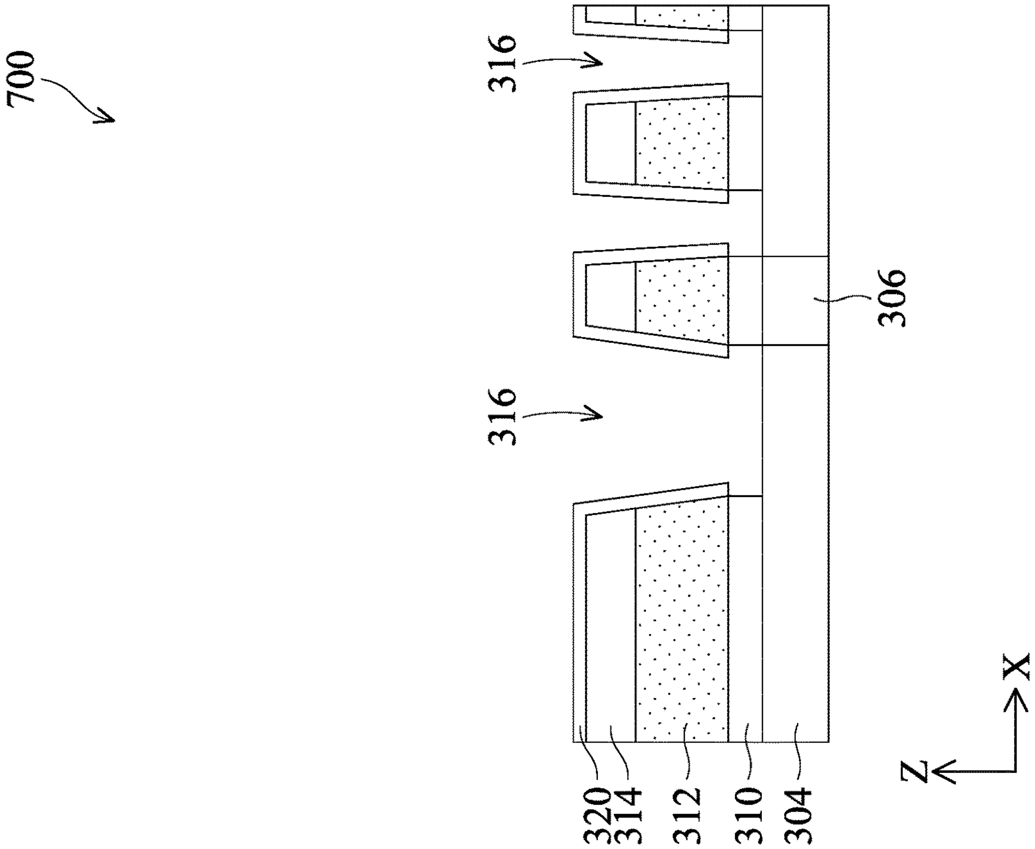
Figure 7C:
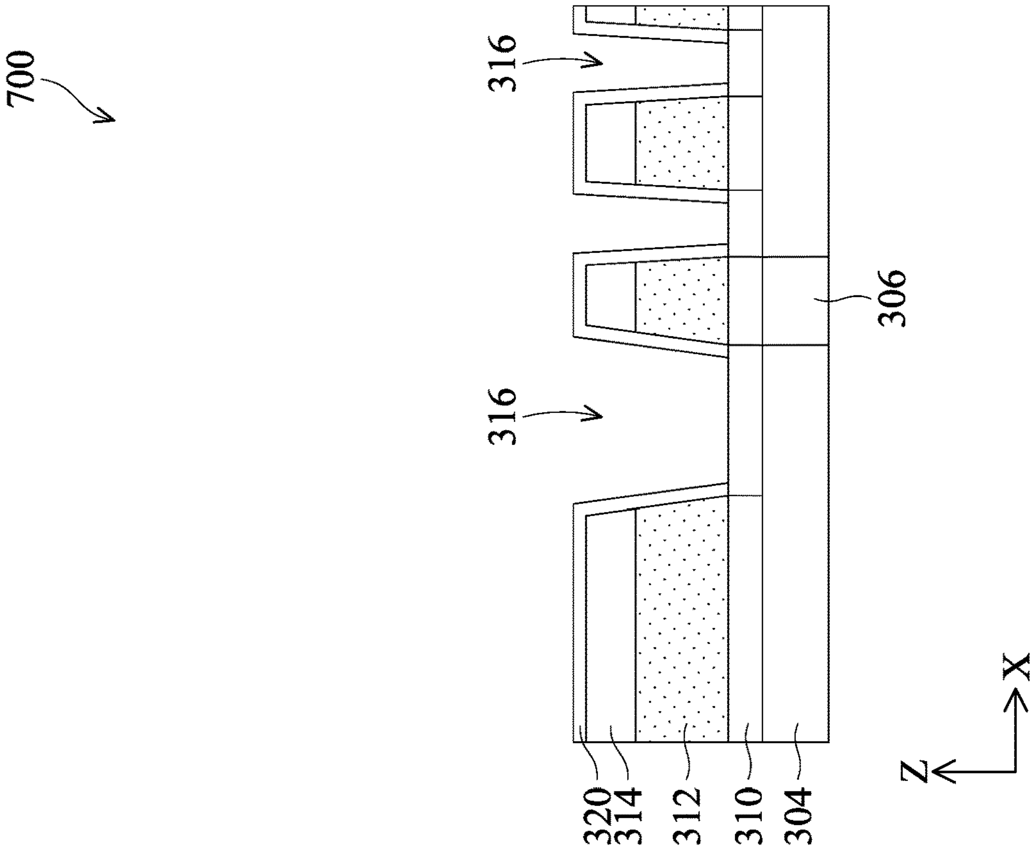
Figure 7F:
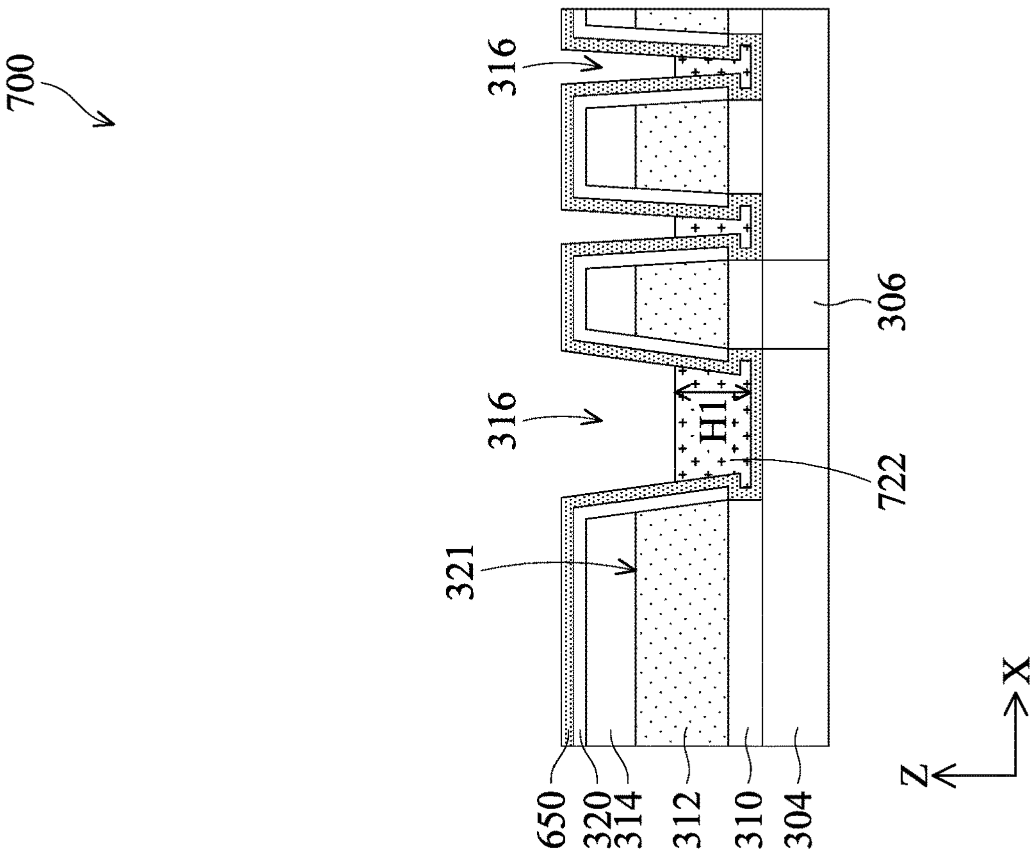
Figure 7E:
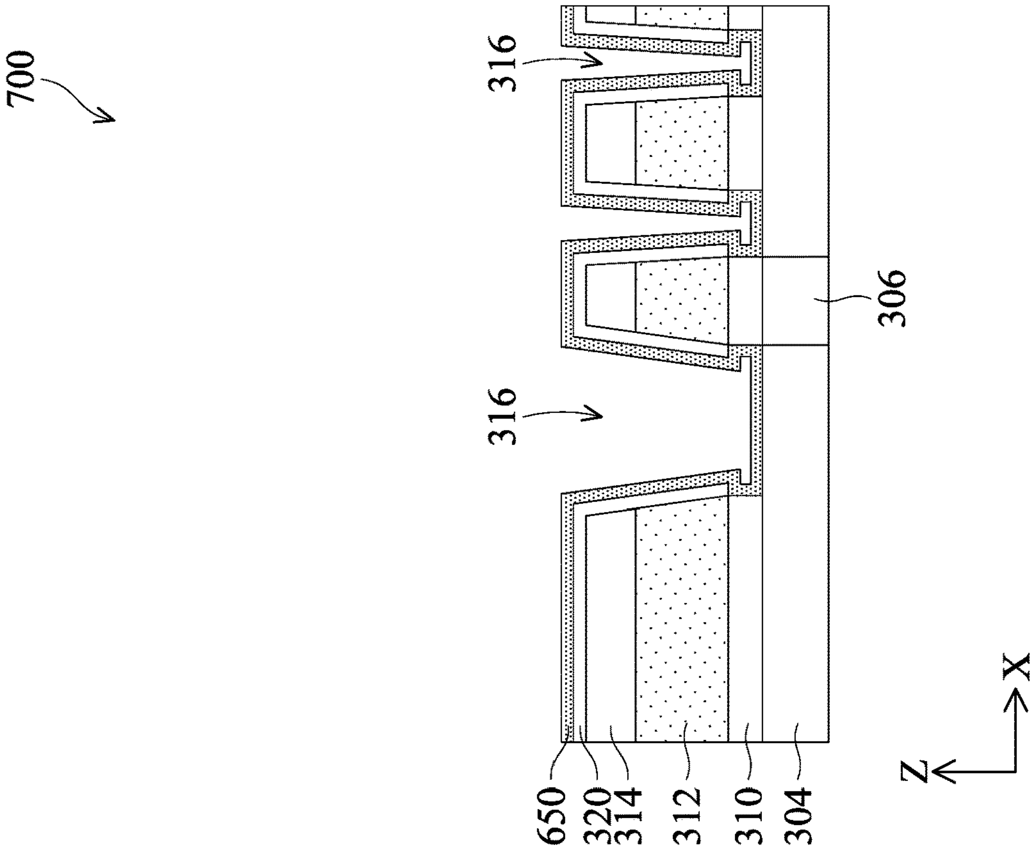
Figure 7H:
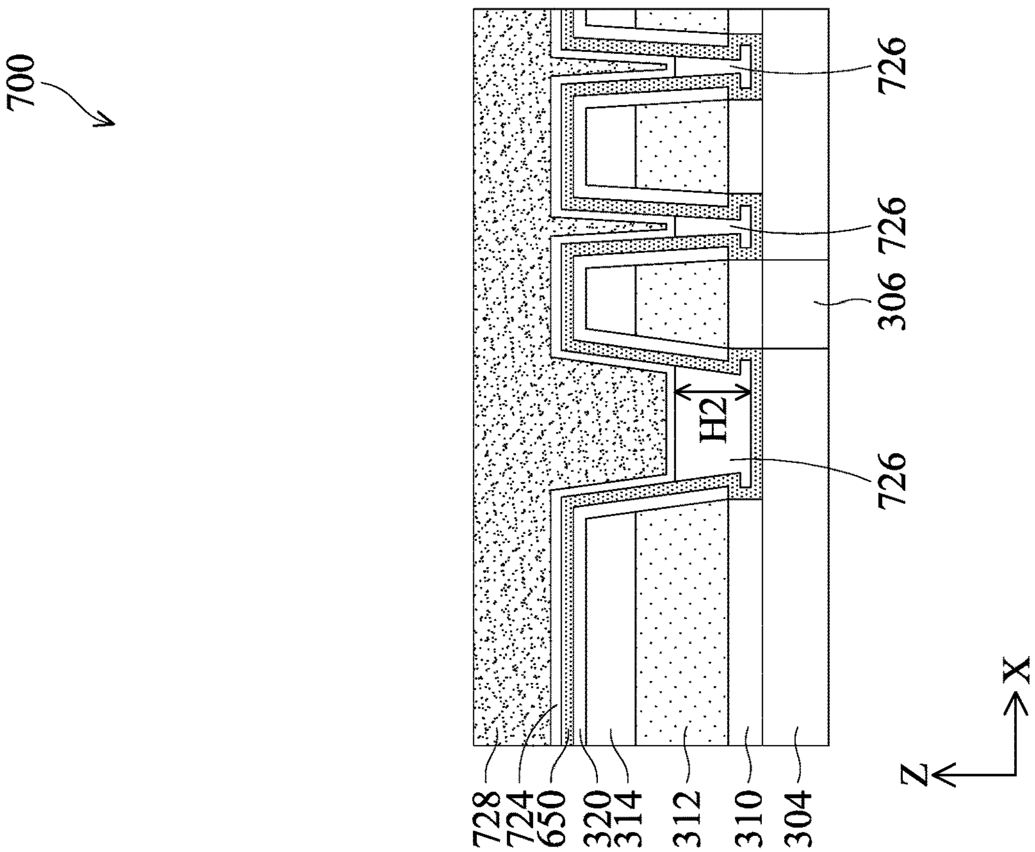
Figure 7G:
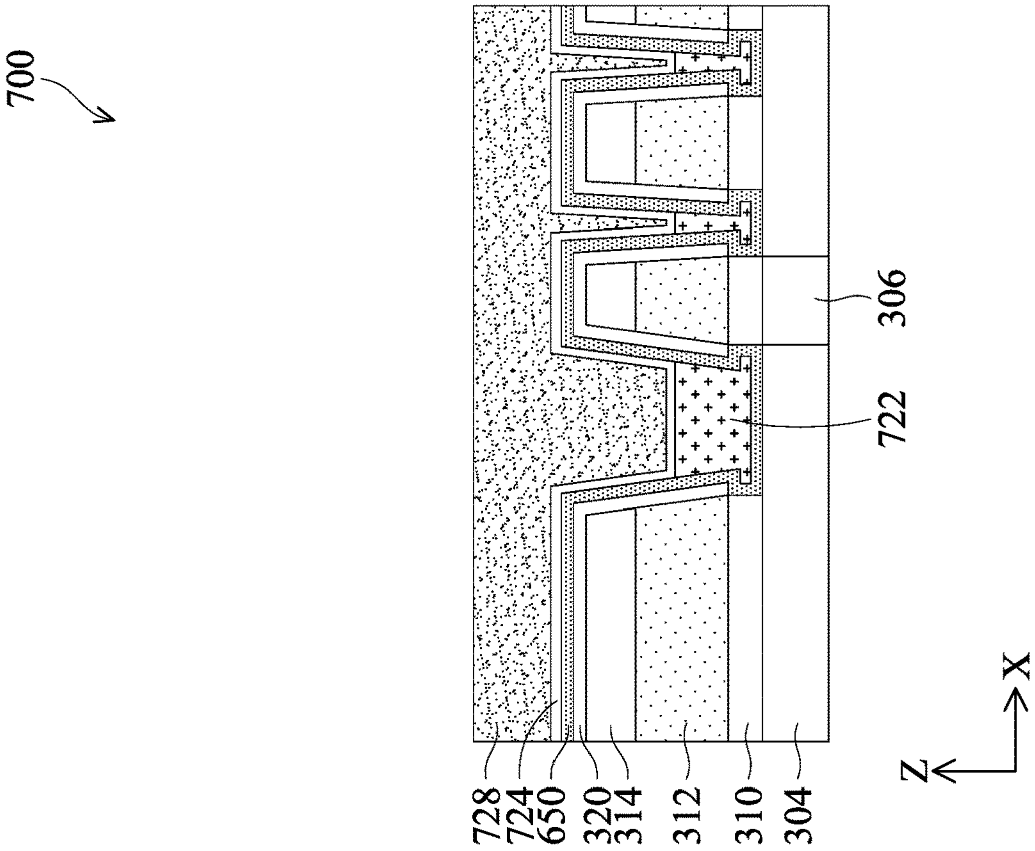
Figure 7I:
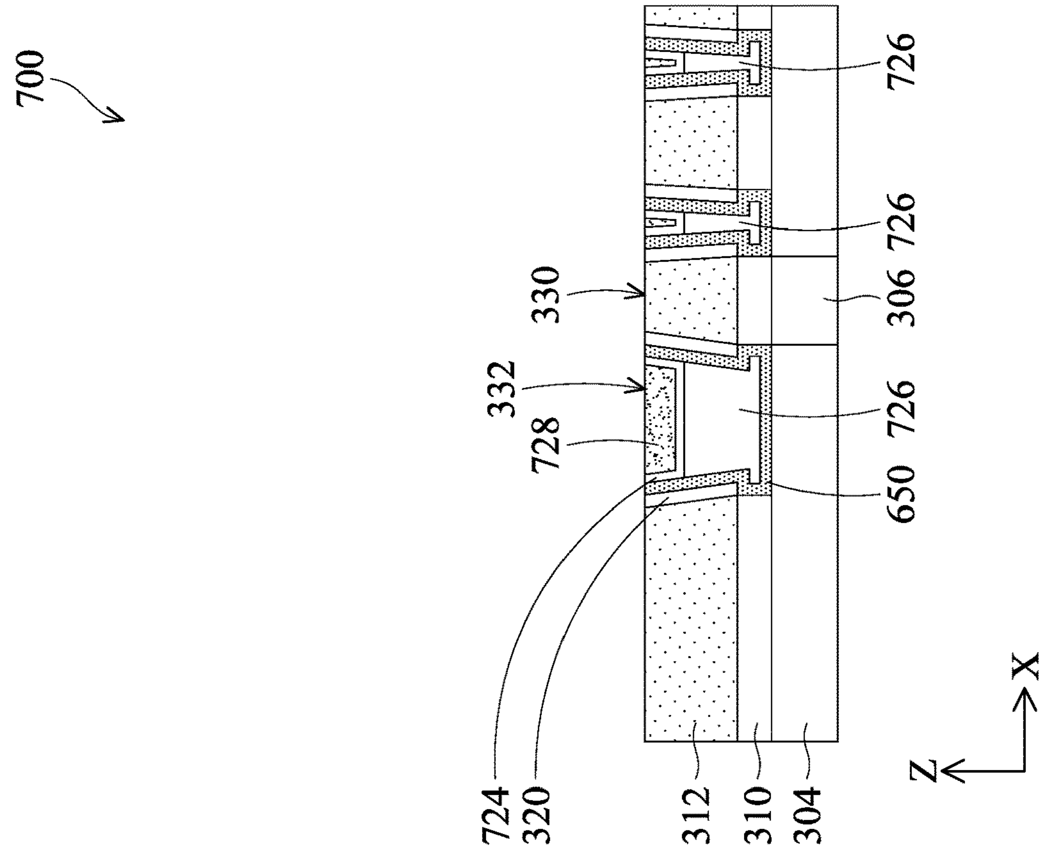
Figure 7J:
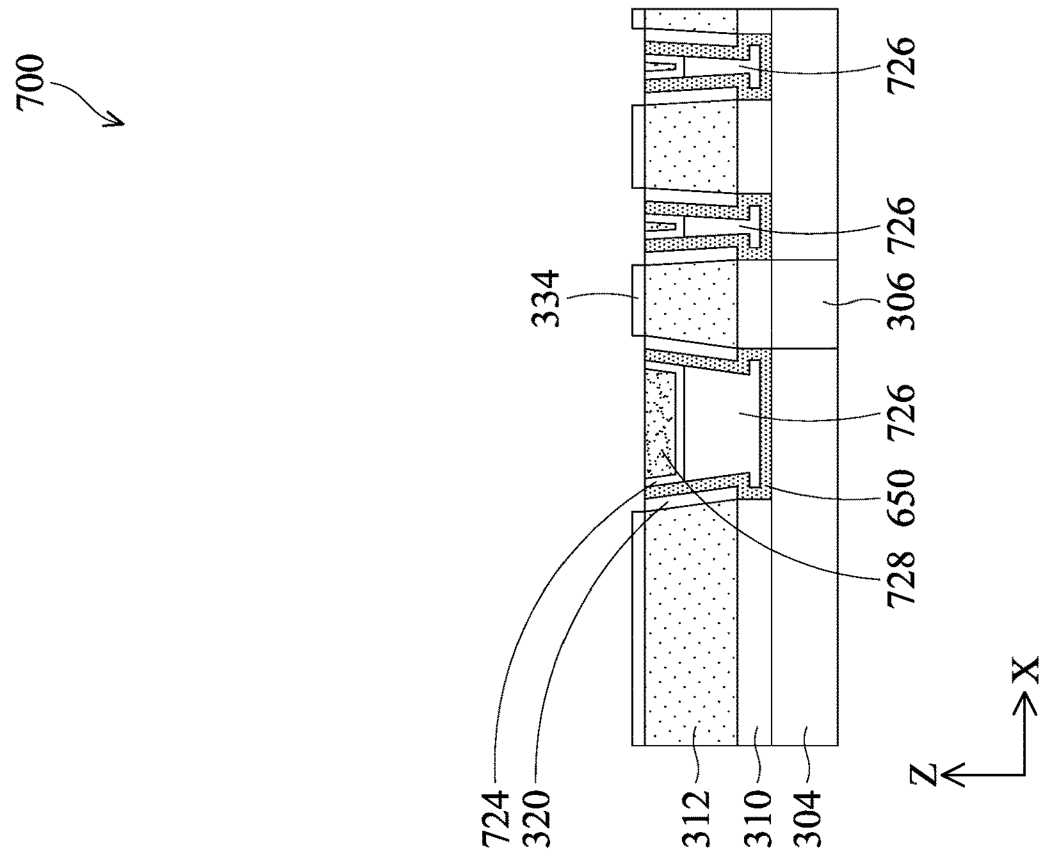
Figure 7L:
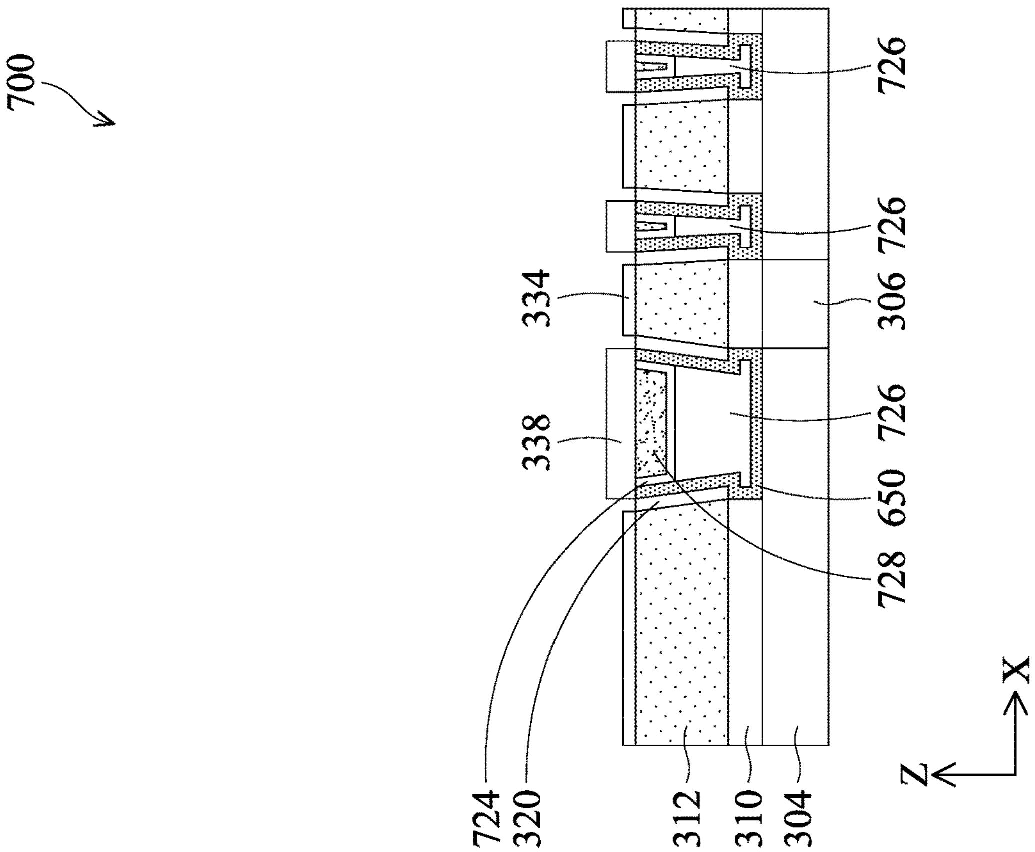
Figure 7K:
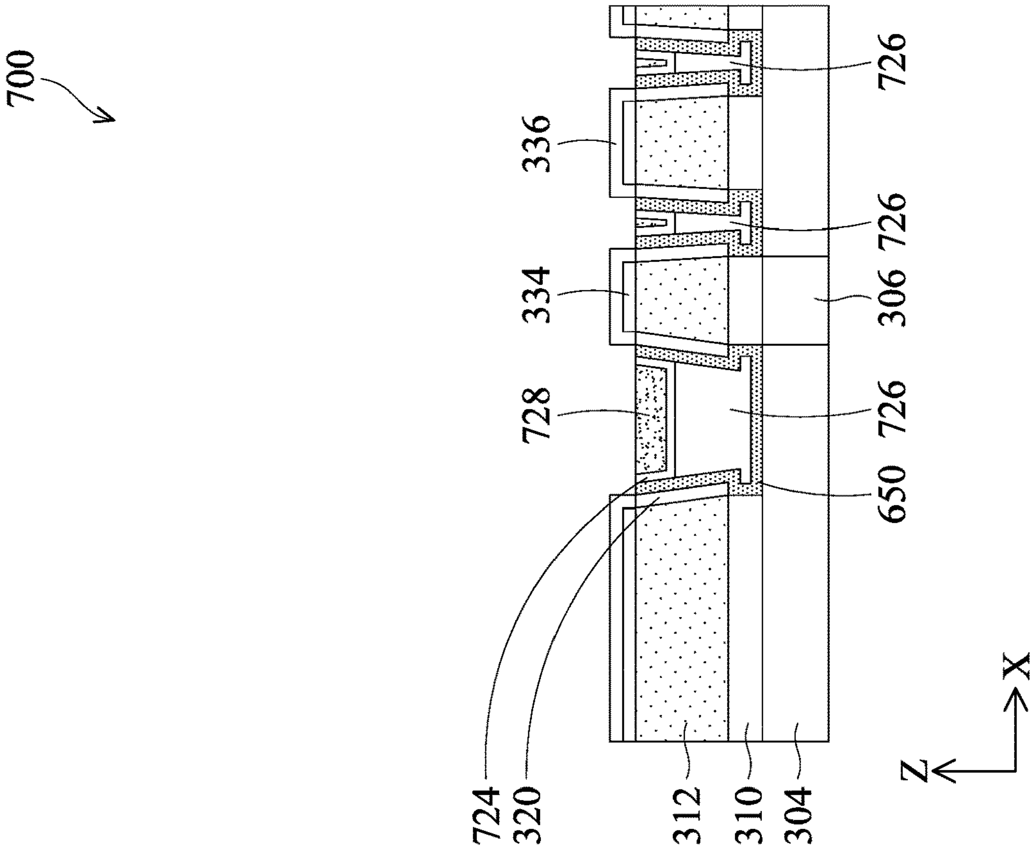
Figure 7N:
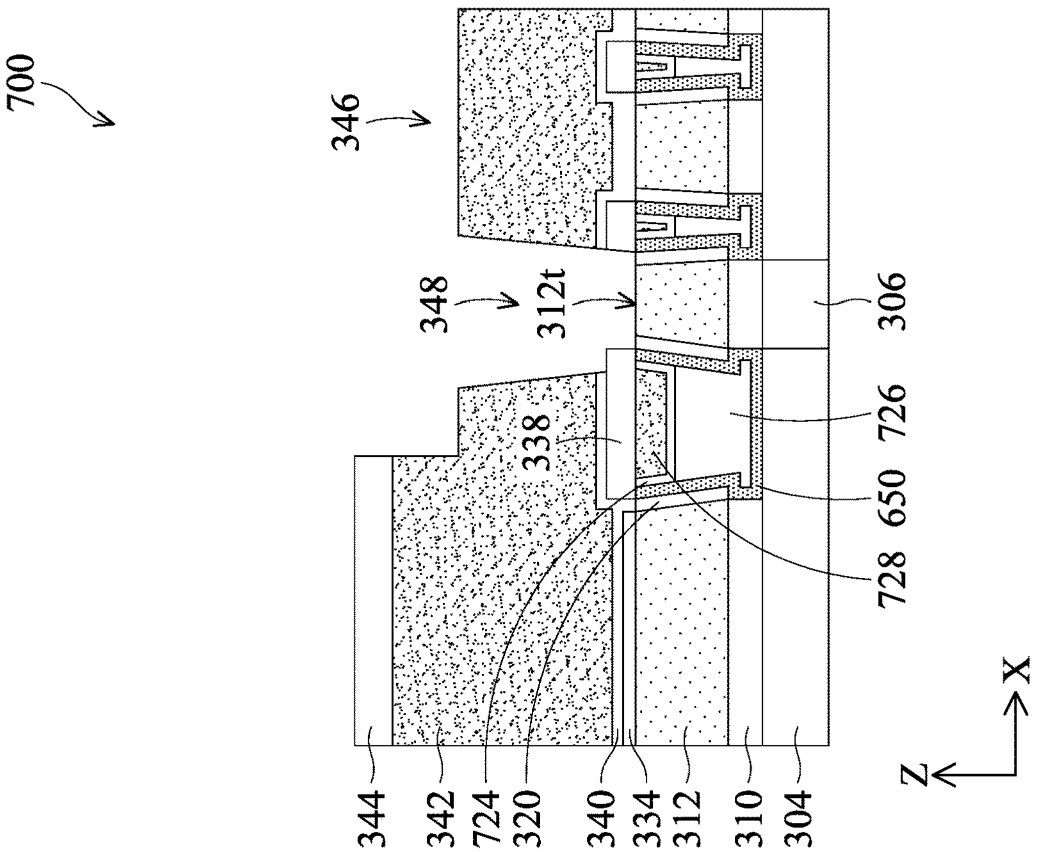
Figure 7M:
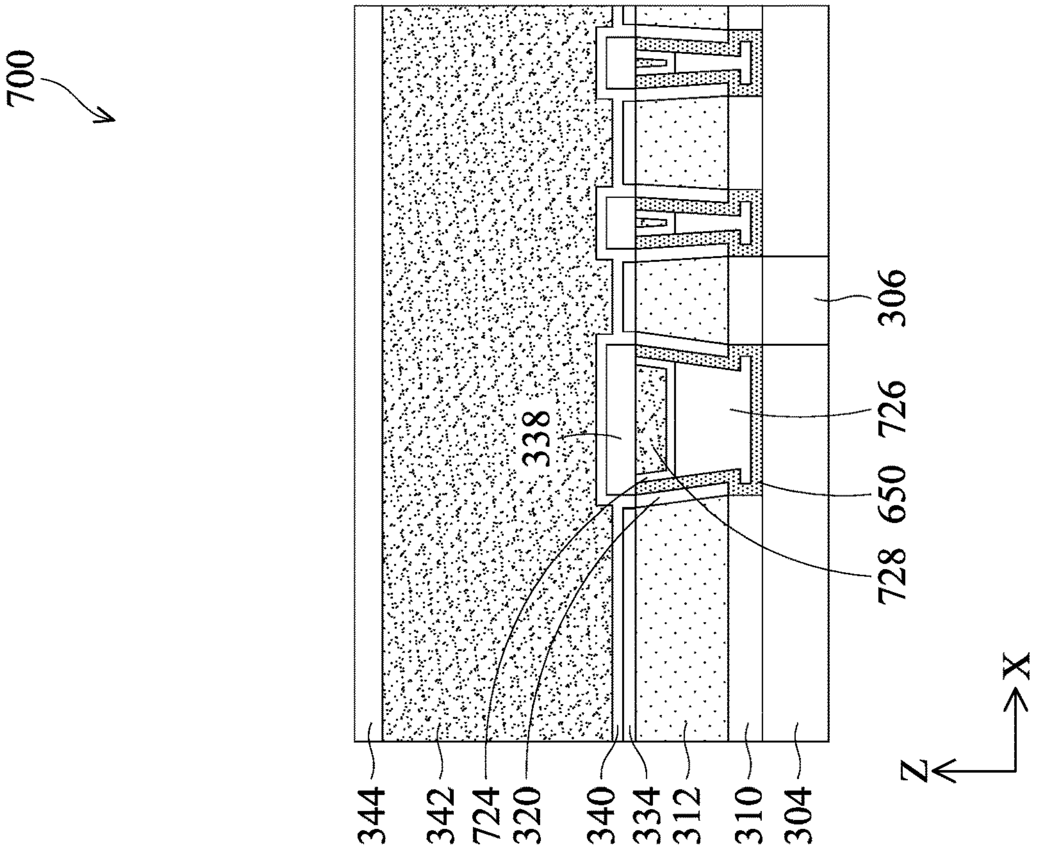
Figure 7P:
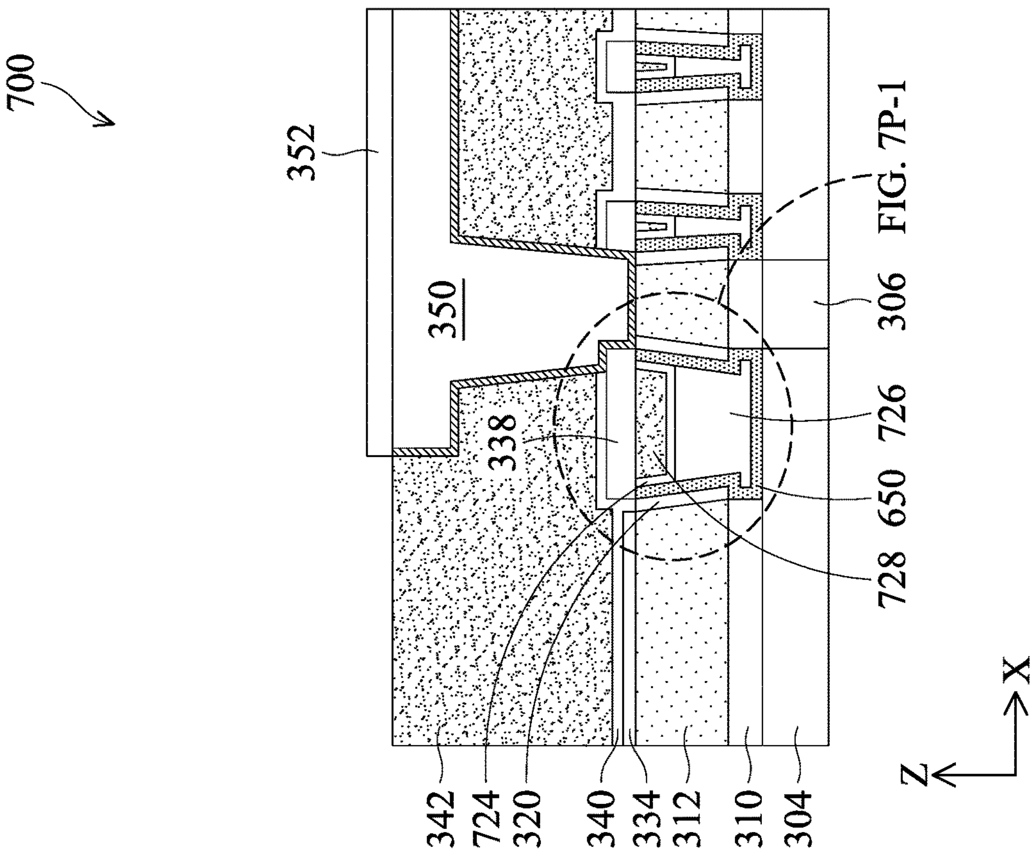

FIGS. 7A-7P-1 are cross-sectional side views of various stages of manufacturing an interconnect structure 700, in accordance with some embodiments. Various embodiments of the interconnect structure 700 may be used to form one or more layers of the interconnect structure 250 shown in FIGS. 1A, 1B and 2. FIGS. 7A-7E are substantially identical to those shown in FIGS. 6A-6E and thus will not be repeated here. In FIG. 7F, after the formation of the capping layer 650, a sacrificial layer 722 is formed in the opening 316 and on the hard mask 314. The sacrificial layer 722 may include a polymer, such as an organic layer having C, O, N, or C, O, N, and/or H. In some embodiments, the sacrificial layer 722 includes polyurea. The sacrificial layer 722 may be formed by any suitable process, such as CVD, ALD, plasma enhanced CVD (PECVD), plasma enhanced ALD (PEALD), or spin-on coating. The sacrificial layer 722 is then recessed to a level below the level of a top surface 321 of the conductive layer 312. The recess of the sacrificial layer 722 may be performed by any suitable process, such as thermal baking, UV curing, an etch-back process (e.g., a plasma etch process), or any combination thereof. The recess of the sacrificial layer 722 may partially open the openings 316, as shown in FIG. 7F. In some embodiments, the recess of the sacrificial layer 722 may expose at least a portion of the capping layer 650 in the openings 316. The remaining sacrificial layer 722 may have a height H1 ranging from about 10 Angstroms to about 1000 Angstroms.

In FIG. 7G, a support layer 724 is formed on the exposed surfaces of the interconnect structure 700. In some embodiments, the support layer 724 is formed on the capping layer 650 and the sacrificial layer 722. The support layer 724 may include Si, O, N, or any combinations thereof. In some embodiments, the support layer 724 includes SiO, SiCO, SiNO, SiCN, or SiCON. The support layer 724 may be porous in order to allow UV energy, thermal energy, or plasma, etc., to reach the sacrificial layer 722 disposed therebelow. The support layer 724 may have a thickness ranging from about 2 Angstroms to about 100 Angstroms, for example about 5 Angstroms to about 50 Angstroms. The support layer 724 may be formed by any suitable process, such as PVD, CVD, ALD, PECVD, or PEALD. In some embodiments, the support layer 724 is a conformal layer formed by low temperature ALD or CVD process. The term "conformal" may be used herein for ease of description upon a layer having substantial same thickness over various regions.

Next, a dielectric material 728 is formed on the support layer 724. The dielectric material 728 may include a silicon-containing material, such as SiCO, SiCN, SiN, SiCON, $SiO_x$, SiC, or SiON. In some embodiments, the dielectric material 728 includes a low-k dielectric material, such as SiCOH, having a k value ranging from about 2 to about 3.6. The low-k dielectric material may have a porosity ranging from about 0.1 percent to about 40 percent. The dielectric material 328 may fill the portion of the openings 316 (FIG. 7F) over the support layer 724 and may be formed over the hard mask 314. The dielectric material 728 may be formed by CVD, ALD, PECVD, PEALD, or other suitable process.

In FIG. 7H, the sacrificial layer 722 is removed, forming an air gap 726 in each opening 316 below the support layer 724. The removal of the sacrificial layer 722 may be a result of degradation or decomposition of the sacrificial layer 722. The decomposition or degradation of the sacrificial layer 722 may be performed by any suitable process, such as thermal baking and/or UV curing. In some embodiments, an UV curing process is performed to remove the sacrificial layer 722. The UV energy may pass through the porous support layer 724 to reach and remove the sacrificial layer 722. The UV energy may have an energy density ranging from about 10 $mJ/cm^2$ to about 100 $J/cm^2$. The removal of the sacrificial layer 722 does not substantially affect the other layers of the interconnect structure 700. The air gap 726 may have the height H2, which is substantially the same as the height H1 of the sacrificial layer 722 shown in FIG. 7F. The air gap 726 may reduce capacitive coupling between neighboring portions of the conductive layer 312. If the height H2 is less than about 10 Angstroms, the air gap 726 may not provide reduced capacitive coupling between neighboring portions of the conductive layer 312. On the other hand, if the height H2 is greater than about 1000 Angstroms, the support layer 724 may not have enough contact on the barrier layer 320 to prevent materials subsequently formed on the support layer 724 from collapsing into the air gap 726.

In FIG. 7I, a planarization process may be performed to remove a portion of the dielectric material 728 formed over the conductive layer 312. The hard mask 314 and the portion of the support layer 724 disposed on the hard mask 314 may be also removed as a result of the planarization process. The planarization process may be any suitable process, such as a CMP process. As a result of the planarization process, the top surface 330 of the conductive layer 312 may be substantially co-planar with the top surface 332 of the dielectric material 728. The remaining dielectric material 728 may have a thickness ranging from about 2 Angstroms to about 1000 Angstroms. The support layer 724 and the dielectric material 728 prevent the materials introduced during the planarization process, for example the slurry, from entering the air gaps 726.

Figure 7O:
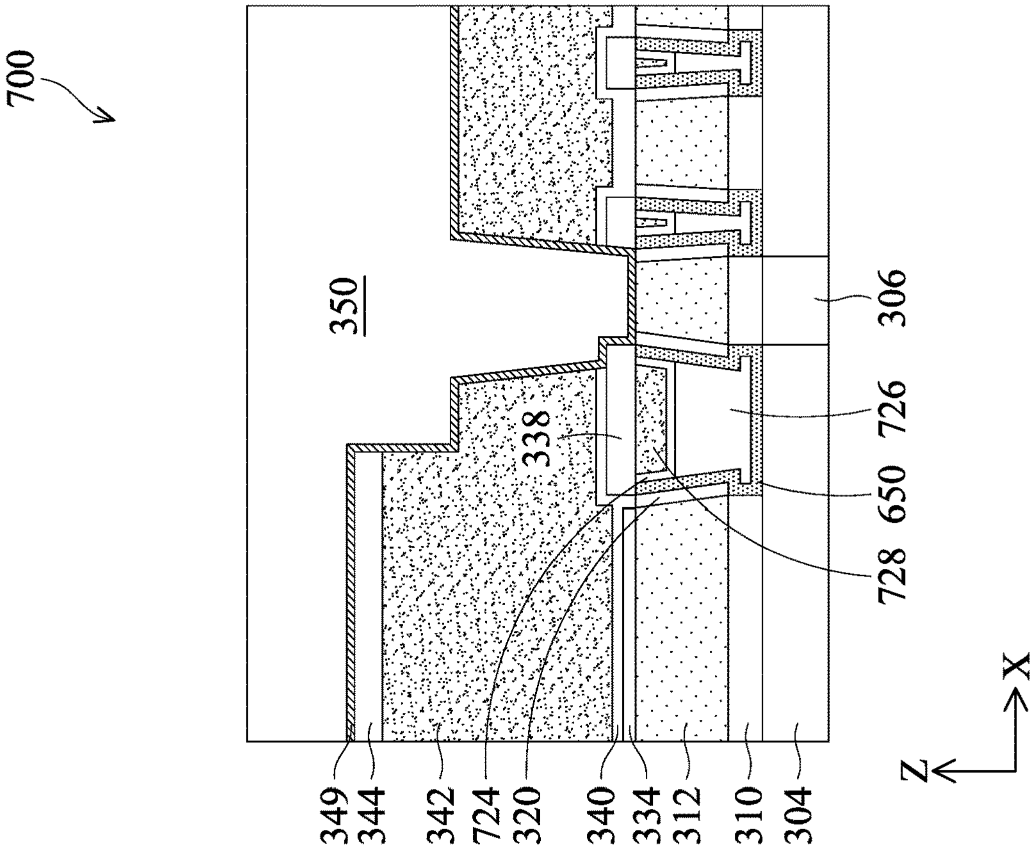
Figures 1, 7P:
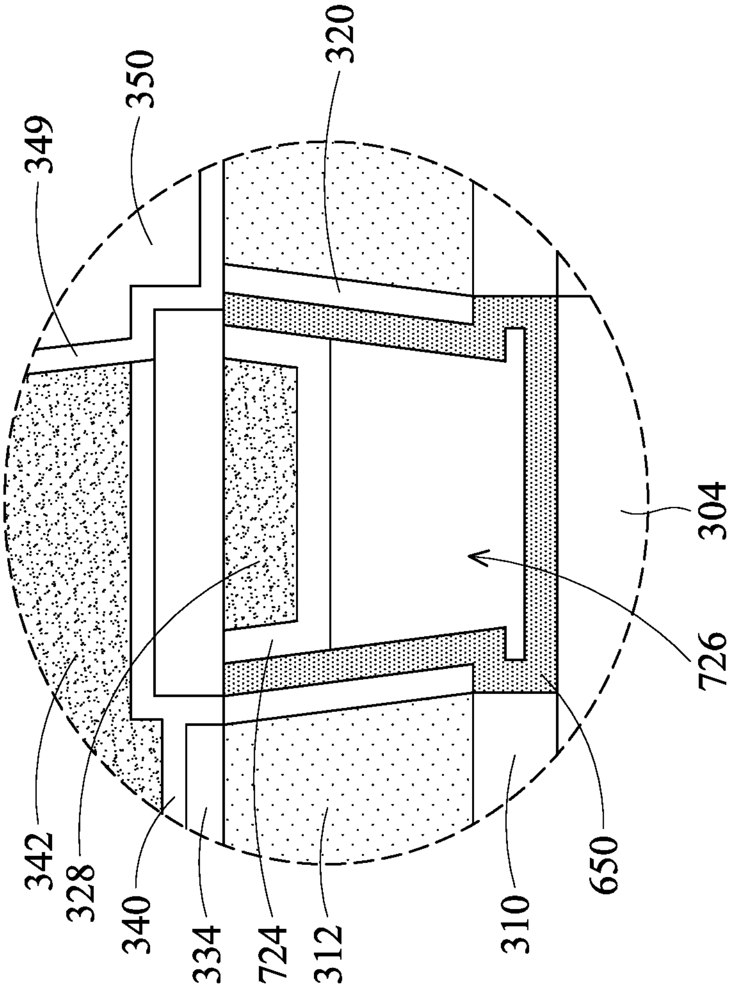

The process discussed above with respect to FIGS. 3F-3L may be performed on the planarized interconnect structure 700. For example, after the planarization process, the cap layer 334 is selectively formed on the top surface 330 of the conductive layer 312 (FIG. 7J). The second blocking layer 336 is then formed on the metallic surfaces of the cap layer 334 and the barrier layer 320. The second blocking layer 336 does not form on the dielectric surfaces of the support layer 724, the dielectric material 728, and the capping layer 650, as shown in FIG. 7K. Next, the metal oxide layer 338 is formed on the exposed top surfaces 332 (FIG. 7I) of the dielectric material 328 and the support layer 724. The metal oxide layer 338 does form not on the second blocking layer 336 and the barrier layer 320 (FIG. 7L), as discussed above with respect to FIG. 3H. The second blocking layer 336 is then removed by a plasma etch or any suitable process. Thereafter, the etch stop layer 340, the dielectric material 342, and hard mask 344 are sequentially formed on the exposed surfaces of the metal oxide layer 338, the cap layer 334, and the barrier layer 320, as shown in FIG. 7M. Via openings 346 and trench openings 348 are then formed in the hard mask 344 and the dielectric material 342 (FIG. 7N). In FIG. 7O, the barrier layer 349 and the conductive feature 350 are formed in the openings 346, 348. A planarization process is performed to remove the portion of the barrier layer 349 and the conductive feature 350 until the dielectric material 342 is exposed. The cap layer 352 is then selectively formed on the conductive feature 350, as shown in FIG. 7P. While not shown, it is contemplated that one or more BEOL processes may be performed on the dielectric material 342 and the cap layer 352.

FIG. 7P-1 illustrates an enlarged view of a portion of the interconnect structure 700 shown in FIG. 7P, in accordance some embodiments. In some embodiments, the air gap 726 is encircled by the capping layer 650 and the support layer 724, which are disposed between neighboring portions of the conductive layer 312. The support layer 724 and the dielectric material 728 are disposed over the air gap 726. Each of the conductive features includes the conductive layer 312 disposed between the glue layer 310 and the cap layer 334. A bottom portion of the capping layer 650 is in contact with the dielectric layer 304 and has a footing profile extended radially into a region defined by the barrier layer 320, the glue layer 310, and the dielectric layer 304. The barrier layer 320 is extended to cover the entire sidewall of the conductive layer 312. An upper portion of the capping layer 650 is disposed between and in contact with the barrier layer 320 and the support layer 724. The dielectric material 728 is sandwiched between and in contact with the support layer 724 and the metal oxide layer 338. The bottom of the metal oxide layer 338 is further in contact with the support layer 724 and the capping layer 650. A portion of the top surface and at least one side of the metal oxide layer 338 are in contact with the etch stop layer 340, and a portion of the top surface and at least one side of the metal oxide layer 338 are in contact with the barrier layer 349. The space where the air gap 726 is located has a general inverted T-shaped profile expanding outwardly along a direction away from the dielectric layer 304.

Embodiments of the present disclosure provide interconnect structures with reduced contact resistance and capacitive coupling between neighboring conductive features by providing separate metal barrier layers disposed on neighboring portions of the conductive layer. The separate barrier layers may reduce line to line leakage that may otherwise occur due to TDDB failure from the use of dielectric barrier between the dielectric material and the dielectric layer. In some embodiments, an air gap may be instead disposed between neighboring portions of the conductive layer, and a support layer and the dielectric material are disposed over the air gap. The air gap may reduce capacitive coupling between the neighboring portions of the conductive layer. The support layer prevents materials from filling the air gap.

An embodiment is an interconnect structure. The structure includes a dielectric layer, a conductive feature disposed in the dielectric layer, and a conductive layer disposed over the dielectric layer, wherein the conductive layer includes a first portion and a second portion adjacent the first portion. The structure also includes a first barrier layer in contact with the first portion of the conductive layer, a second barrier layer in contact with the second portion of the conductive layer, and a dielectric material disposed between and in contact with the first and second barrier layers, wherein a bottom surface of the second barrier layer and a bottom surface of the dielectric material are substantially co-planar.

Another embodiment is an interconnect structure. The structure includes a dielectric layer, a first conductive feature disposed in the dielectric layer, a conductive layer disposed over the dielectric layer, wherein the conductive layer includes a first portion and a second portion adjacent the first portion, and the second portion of the conductive layer is disposed over the first conductive feature. The structure also includes a first barrier layer in contact with the first portion of the conductive layer, a second barrier layer in contact with the second portion of the conductive layer, wherein the first and second barrier layers are separated by an air gap. The structure further includes a capping layer in contact with the first barrier layer, the second barrier layer, and the dielectric layer, wherein a portion of the capping layer is exposed to the air gap.

A further embodiment is a method for forming an interconnect structure. The method includes forming a conductive layer over a dielectric layer, forming one or more openings in the conductive layer to expose portions of the dielectric layer, wherein the one or more openings separates the conductive layer into one or more portions. The method also includes forming a blocking layer on an exposed surface of the dielectric layer, forming barrier layers in contact with the portions of the conductive layer, forming a capping layer on the barrier layers, forming a dielectric material on the capping layer to fill the one or more openings, and performing a planarization process until the portions of the conductive layer are exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an interconnect structure, comprising:

forming a conductive layer over a dielectric layer;

forming one or more openings in the conductive layer to expose portions of the dielectric layer, wherein the one or more openings separates the conductive layer into one or more portions;

forming a blocking layer on an exposed surface of the dielectric layer;

forming barrier layers in contact with the portions of the conductive layer;

forming a capping layer on the barrier layers;

forming a dielectric material on the capping layer to fill the one or more openings; and performing a planarization process until the portions of the conductive layer are exposed.

2. The method of claim 1, further comprising:

prior to forming the capping layer, removing the blocking layer.

3. The method of claim 1, wherein the blocking layer comprises a self-assembled monolayer (SAM).

4. The method of claim 1, wherein the barrier layers comprise a refractory metal nitride.

5. The method of claim 1, wherein the barrier layers are formed by atomic layer deposition.

6. The method of claim 1, further comprising:

after the planarization process, selectively forming a cap layer on a top surface of the portions of the conductive layer.

7. The method of claim 1, further comprising:

forming a metal oxide layer on the dielectric material after the planarization process.

8. The method of claim 1, wherein top surfaces of the conductive layer and the dielectric material are substantially co-planar after the planarization process.

9. A method for forming an interconnect structure, comprising:

forming a conductive layer over a dielectric layer;

forming one or more openings in the conductive layer;

forming a blocking layer on exposed portions of the dielectric layer;

selectively forming barrier layers on the conductive layer;

removing the blocking layer;

forming a dielectric material directly on the dielectric layer and between adjacent portions of the conductive layer; and performing a planarization process until the conductive layer is exposed.

10. The method of claim 9, wherein removing the blocking layer comprises a plasma treatment.

11. The method of claim 9, wherein the dielectric material forms an inverted T-shaped profile at a bottom portion.

12. The method of claim 11, wherein the dielectric material contacts a bottom surface of the barrier layers.

13. The method of claim 9, wherein the barrier layers comprise titanium nitride or tantalum nitride.

14. The method of claim 9, further comprising:

prior to forming the barrier layers, forming a glue layer on sidewalls of the portions of the conductive layer.

15. A method for forming an interconnect structure, comprising:

forming a conductive layer over a dielectric layer;

forming one or more openings in the conductive layer to expose portions of the dielectric layer, wherein the one or more openings separates the conductive layer into one or more portions;

forming a blocking layer on an exposed surface of the dielectric layer;

forming barrier layers on the portions of the conductive layer;

removing the blocking layer;

forming a capping layer on the barrier layers and the dielectric layer;

forming a sacrificial layer in the one or more openings and over a hard mask;

recessing the sacrificial layer to a level below a top surface of the portions of the conductive layer;

forming a support layer on the capping layer and the recessed sacrificial layer;

forming a dielectric material on the support layer to fill remaining portions of the one or more openings;

removing the sacrificial layer to form an air gap between neighboring portions of the conductive layer; and performing a planarization process until the portions of the conductive layer are exposed.

16. The method of claim 15, wherein removing the sacrificial layer comprises performing a UV curing process.

17. The method of claim 15, wherein the support layer is porous and comprises a silicon-containing material selected from the group consisting of SiO, SiCO, SiNO, SiCN, and SiCON.

18. The method of claim 15, further comprising:

after the planarization process, forming a metal oxide layer on a top surface of the dielectric material.

19. The method of claim 15, wherein the air gap has an inverted T-shaped profile.

20. The method of claim 15, further comprising:

selectively forming a cap layer on a top surface of the portions of the conductive layer after the planarization process.

* * * * *